United States Patent
Yater et al.

(10) Patent No.: US 7,471,560 B2
(45) Date of Patent: Dec. 30, 2008

(54) ELECTRONIC DEVICE INCLUDING A MEMORY ARRAY AND CONDUCTIVE LINES

(75) Inventors: Jane A. Yater, Austin, TX (US); Gowrishankar L. Chindalore, Austin, TX (US); Cheong M. Hong, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/834,391

(22) Filed: Aug. 6, 2007

(65) Prior Publication Data

US 2008/0019178 A1   Jan. 24, 2008

Related U.S. Application Data

(62) Division of application No. 11/188,898, filed on Jul. 25, 2005, now Pat. No. 7,262,997.

(51) Int. Cl.
*G11C 11/34* (2006.01)
(52) U.S. Cl. .................. 365/185.03; 365/185.05; 365/185.18; 365/185.26; 365/185.33
(58) Field of Classification Search ............ 365/185.03, 365/185.05, 185.17, 185.18, 185.26, 185.29, 365/185.33, 63, 104
See application file for complete search history.

(56) References Cited

U.S. PATENT DOCUMENTS

| | | |
|---|---|---|
| 4,184,207 A | 1/1980 | McElroy |
| 4,751,558 A | 6/1988 | Kenney |
| 4,785,337 A | 11/1988 | Kenney |
| 4,833,094 A | 5/1989 | Kenney |
| 4,860,070 A | 8/1989 | Arimoto et al. |
| 5,196,722 A | 3/1993 | Bergendahl et al. |
| 5,252,845 A | 10/1993 | Kim et al. |
| 5,315,142 A | 5/1994 | Acovic et al. |
| 5,432,365 A | 7/1995 | Chin et al. |
| 5,460,988 A | 10/1995 | Hong |
| 5,567,635 A | 10/1996 | Acovic et al. |
| 5,705,415 A | 1/1998 | Orlowski et al. |
| 5,721,448 A | 2/1998 | Hauf et al. |
| 5,824,580 A | 10/1998 | Hauf et al. |
| 5,914,523 A | 6/1999 | Bashir et al. |
| 5,923,046 A | 7/1999 | Tezuka et al. |
| 5,969,383 A | 10/1999 | Chang et al. |

(Continued)

OTHER PUBLICATIONS

U.S. Appl. No. 11/626,762, filed Jan. 24, 2007.

(Continued)

*Primary Examiner*—Trong Phan

(57) ABSTRACT

An electronic circuit can include a first memory cell and a second memory cell. In one embodiment, source/drain regions of the first and second memory cells can be electrically connected to each other. The source/drain regions may electrically float regardless of direction in which carriers flow through channel regions of the memory cells. In another embodiment, the first memory cell can be electrically connected to a first gate line, and the second memory cell can be electrically connected to a greater number of gate lines as compared to the first memory cell. In another aspect, the first and second memory cells are connected to the same bit line. Such bit line can electrically float when programming or reading the first memory cell or the second memory cell or any combination thereof.

19 Claims, 22 Drawing Sheets

U.S. PATENT DOCUMENTS

| | | | |
|---|---|---|---|
| 5,998,263 A | 12/1999 | Sekariapuram et al. | |
| 6,074,954 A | 6/2000 | Lill et al. | |
| 6,117,733 A | 9/2000 | Sung et al. | |
| 6,121,148 A | 9/2000 | Bashir et al. | |
| 6,172,905 B1 * | 1/2001 | White et al. | 365/185.03 |
| 6,228,706 B1 | 5/2001 | Horak et al. | |
| 6,265,268 B1 | 7/2001 | Halliyal et al. | |
| 6,281,064 B1 | 8/2001 | Mandelman et al. | |
| 6,307,782 B1 | 10/2001 | Sadd et al. | |
| 6,320,784 B1 | 11/2001 | Muralidhar et al. | |
| 6,330,184 B1 | 12/2001 | White et al. | |
| 6,365,452 B1 | 4/2002 | Perng et al. | |
| 6,399,441 B1 | 6/2002 | Ogura et al. | |
| 6,486,028 B1 | 11/2002 | Chang et al. | |
| 6,537,870 B1 | 3/2003 | Shen | |
| 6,559,032 B2 | 5/2003 | Gonzalez et al. | |
| 6,583,466 B2 | 6/2003 | Lin et al. | |
| 6,638,810 B2 | 10/2003 | Bakli et al. | |
| 6,673,681 B2 | 1/2004 | Kocon et al. | |
| 6,674,120 B2 | 1/2004 | Fujiwara | |
| 6,677,204 B2 | 1/2004 | Cleeves et al. | |
| 6,706,599 B1 | 3/2004 | Sadd et al. | |
| 6,734,492 B2 | 5/2004 | Yamazaki et al. | |
| 6,750,499 B2 | 6/2004 | Wu | |
| 6,803,620 B2 | 10/2004 | Moriya et al. | |
| 6,816,414 B1 | 11/2004 | Prinz | |
| 6,818,512 B1 | 11/2004 | Hsieh | |
| 6,818,939 B1 | 11/2004 | Hadizad | |
| 6,852,597 B2 | 2/2005 | Park et al. | |
| 6,853,587 B2 | 2/2005 | Forbes | |
| 6,861,315 B1 | 3/2005 | Chen et al. | |
| 6,894,339 B2 | 5/2005 | Fan et al. | |
| 6,916,715 B2 | 7/2005 | Hsiao et al. | |
| 6,936,887 B2 | 8/2005 | Harari et al. | |
| 6,952,034 B2 | 10/2005 | Hu et al. | |
| 6,958,513 B2 | 10/2005 | Wang et al. | |
| 6,998,313 B2 | 2/2006 | Lin | |
| 7,015,537 B2 | 3/2006 | Lee et al. | |
| 7,078,286 B1 | 7/2006 | Mehta | |
| 7,098,502 B2 | 8/2006 | Mathew et al. | |
| 7,112,490 B1 | 9/2006 | Hong et al. | |
| 7,196,935 B2 | 3/2007 | Forbes | |
| 7,199,419 B2 | 4/2007 | Haller | |
| 7,205,608 B2 | 4/2007 | Chindalore et al. | |
| 7,211,487 B2 | 5/2007 | Chindalore et al. | |
| 7,211,858 B2 | 5/2007 | Prinz | |
| 7,218,544 B2 * | 5/2007 | Yamauchi | 365/104 |
| 7,220,634 B2 | 5/2007 | Prall et al. | |
| 7,226,840 B2 | 6/2007 | Chindalore et al. | |
| 7,238,599 B2 | 7/2007 | Forbes | |
| 7,244,987 B2 | 7/2007 | Forbes | |
| 7,250,340 B2 | 7/2007 | Swift et al. | |
| 2005/0146938 A1 | 7/2005 | Forbes | |
| 2005/0148173 A1 | 7/2005 | Shone | |
| 2005/0280094 A1 | 12/2005 | Forbes | |
| 2006/0011966 A1 | 1/2006 | Wang | |
| 2006/0046383 A1 | 3/2006 | Chen et al. | |
| 2006/0076586 A1 | 4/2006 | Swift et al. | |
| 2006/0076609 A1 | 4/2006 | Chindalore et al. | |
| 2006/0131640 A1 | 6/2006 | Yu et al. | |
| 2006/0166443 A1 | 7/2006 | Forbes | |
| 2007/0018216 A1 | 1/2007 | Chindalore et al. | |
| 2007/0018221 A1 | 1/2007 | Swift et al. | |
| 2007/0018222 A1 | 1/2007 | Sadd et al. | |
| 2007/0018229 A1 | 1/2007 | Yater et al. | |
| 2007/0018232 A1 | 1/2007 | Chindalore et al. | |
| 2007/0018234 A1 | 1/2007 | Chindalore et al. | |
| 2007/0019472 A1 | 1/2007 | Yater et al. | |
| 2007/0020831 A1 | 1/2007 | Chindalore et al. | |
| 2007/0020840 A1 | 1/2007 | Chindalore | |
| 2007/0020851 A1 | 1/2007 | Hong et al. | |
| 2007/0020856 A1 | 1/2007 | Sadd et al. | |

OTHER PUBLICATIONS

U.S. Appl. No. 11/626,753 filed Jan. 24, 2007.
U.S. Appl. No. 11/626,768 filed Jan. 24, 2007.
Guan, H., et al. "An Analytical Model for Optimization of Programming Efficiency and Uniformity of Split Gate Source-Side Injection Superflash Memory," IEEE Transactions on Electron Devices, vol. 50, No. 3, pp. 809-815, Mar. 2003.
Hayashi, Y., et al., "Twin MONOS Cell with Dual Control Gates," 2000 Symposium on VLSI Technology Digest of Technical Papers, pp. 122-123, 2000.
Lee, D., et al. "Vertical Floating-Gate 4.5F2 Split-Gate NOR Flash Memory at 110nm Node," 2004 Symposium on VLSI Technology Digest of Technical Papers, pp. 72-73, 2004.
Ma, Y. et al. "A Dual-Bit Split-Gate EEPROM (DSG) Cell in Contactless Array for Single-Vcc High Density Flash Memories," IEDM, p. 57-60, 1994.
Osabe, T. et al. "Charge-Injection Length in Silicon Nanocrystal Memory Cells," 2004 Symposium on VLSI Technology Digest of Technical Papers p. 242-243, 2004.
Van Houdt, J., et al. "An Analytical Model for the Optimization of Source-Side Injection Flash EEPROM Devices," IEEE Transactions on Electron Devices, vol. 42, No. 7, pp. 1314-1320, Jul. 1995.
Actions on the Merits by U.S.P.T.O, as of Apr. 16, 2008, 13 pgs.
Yang, Edward S., "8-3 Channel Conductance", Fundamentals of Semiconductor Devices, McGraw-Hill Book Company, p. 205, 1978.

* cited by examiner

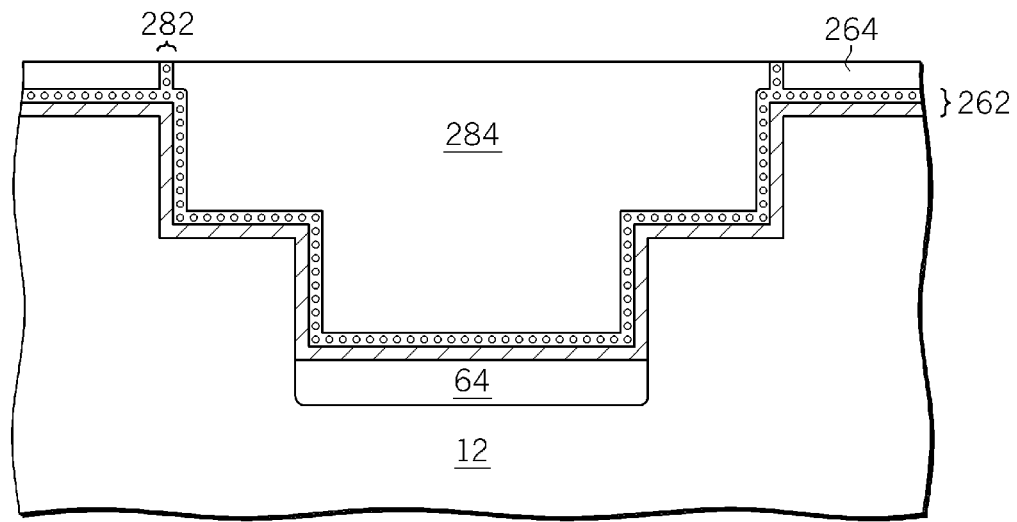
FIG. 29
FIG. 30
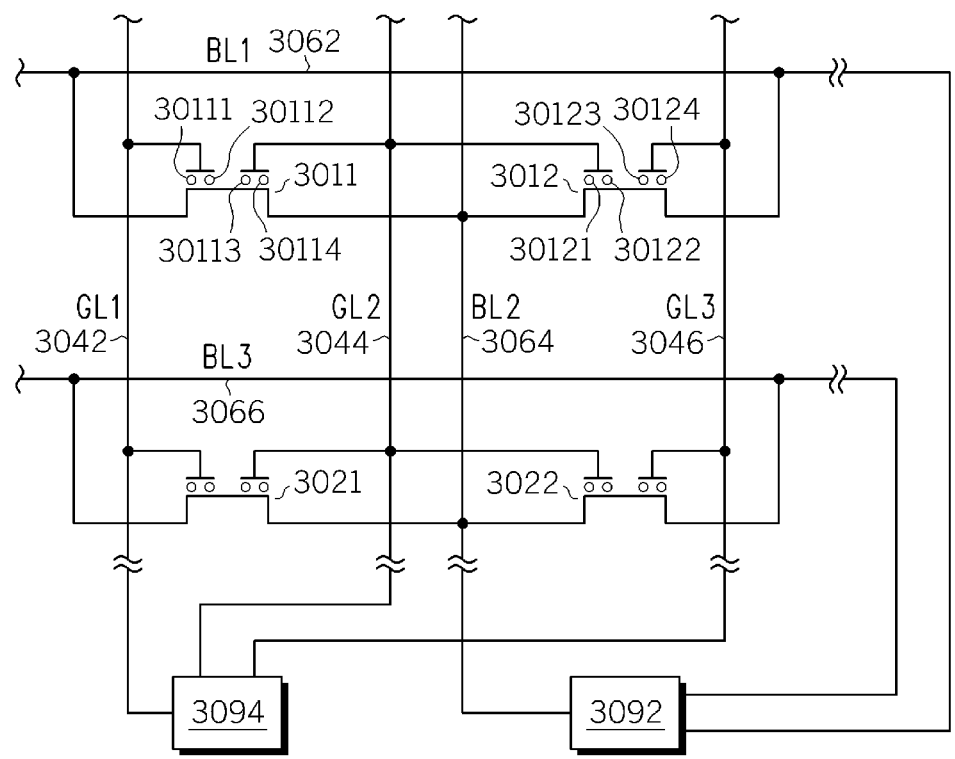

| | CHARGE STORAGE REGION | BL1 3062 | GL1 3042 | GL2 3044 | BL2 3064 | GL3 3046 | BL3 3066 | SUBSTRATE 12 |
|---|---|---|---|---|---|---|---|---|
| PROGRAM | 30111 | 5 | 6 | 6 | 0 | 0 | 0 | 0 |
| | 30112 | 4 | 8 | 6 | 0 | 0 | 0 | 0 |
| | 30113 | 0 | 6 | 8 | 4 | 0 | 4 | 0 |
| | 30114 | 0 | 6 | 6 | 5 | 0 | 5 | 0 |
| | 30121 | 0 | 0 | 6 | 5 | 6 | 5 | 0 |
| | 30122 | 0 | 0 | 8 | 4 | 6 | 4 | 0 |
| | 30123 | 4 | 0 | 6 | 0 | 8 | 0 | 0 |
| | 30124 | 5 | 0 | 6 | 0 | 6 | 0 | 0 |
| ERASE | ALL | F | 7 | 7 | F | 7 | F | −7 |
| READ | 30111 | 0 | 3.5 | 6 | 2 | 0 | 2 | 0 |
| | 30112 | 2 | 3.5 | 4.5 | 0 | 0 | 0 | 0 |
| | 30113 | 0 | 4.5 | 3.5 | 2 | 0 | 2 | 0 |
| | 30114 | 2 | 6 | 3.5 | 0 | 0 | 0 | 0 |
| | 30121 | 2 | 0 | 3.5 | 0 | 6 | 0 | 0 |
| | 30122 | 0 | 0 | 3.5 | 2 | 4.5 | 2 | 0 |
| | 30123 | 2 | 0 | 4.5 | 0 | 3.5 | 0 | 0 |
| | 30124 | 0 | 0 | 6 | 2 | 3.5 | 2 | 0 |

| CHARGE STORAGE REGION | BL1 3362 | CG1 3382 | BL2 3364 | CG2 3384 | BL3 3366 | BL4 3368 | CG3 3386 | BL5 3369 | SUBSTRATE 12 |
|---|---|---|---|---|---|---|---|---|---|
| PROGRAM | | | | | | | | | |
| 33111 | 6 | 6 | FLOAT | 10 | 0 | FLOAT | 0 | 0 | 0 |
| 33112 | 0 | 6 | FLOAT | 10 | 6 | FLOAT | 0 | 6 | 0 |
| 33121 | 6 | 10 | FLOAT | 6 | 0 | FLOAT | 0 | 0 | 0 |
| 33122 | 0 | 10 | FLOAT | 6 | 6 | FLOAT | 0 | 6 | 0 |
| 33131 | 0 | 0 | FLOAT | 6 | 6 | FLOAT | 10 | 6 | 0 |
| 33132 | 6 | 0 | FLOAT | 6 | 0 | FLOAT | 10 | 0 | 0 |
| 33141 | 0 | 0 | FLOAT | 10 | 6 | FLOAT | 6 | 6 | 0 |
| 33142 | 6 | 0 | FLOAT | 10 | 0 | FLOAT | 6 | 0 | 0 |
| ERASE | | | | | | | | | |
| ALL | F | 7 | FLOAT | 7 | FLOAT | FLOAT | 7 | FLOAT | −7 |
| READ | | | | | | | | | |
| 33111 | 0 | 3.5 | FLOAT | 8 | 3 | FLOAT | 0 | 3 | 0 |
| 33112 | 3 | 3.5 | FLOAT | 8 | 0 | FLOAT | 0 | 0 | 0 |
| 33121 | 0 | 8 | FLOAT | 3.5 | 3 | FLOAT | 0 | 3 | 0 |
| 33122 | 3 | 8 | FLOAT | 3.5 | 0 | FLOAT | 0 | 0 | 0 |
| 33131 | 3 | 0 | FLOAT | 3.5 | 3 | FLOAT | 8 | 3 | 0 |
| 33132 | 0 | 0 | FLOAT | 3.5 | 0 | FLOAT | 8 | 0 | 0 |
| 33141 | 3 | 0 | FLOAT | 8 | 3 | FLOAT | 3.5 | 3 | 0 |
| 33142 | 0 | 0 | FLOAT | 8 | 0 | FLOAT | 3.5 | 0 | 0 |

| | CHARGE STORAGE REGION | BL1 3662 | GL1 3642 | GL2 3644 | GL3 3646 | BL2 3664 | GL4 3648 | GL5 3649 | BL3 3666 | SUBSTRATE 12 |
|---|---|---|---|---|---|---|---|---|---|---|
| PROGRAM | 36111 | 5 | 6 | 6 | 6 | 0 | 0 | 0 | 0 | 0 |
| | 36112 | 4 | 8 | 6 | 6 | 0 | 0 | 0 | 0 | 0 |
| | 36113 | 0 | 6 | 8 | 6 | 4 | 0 | 0 | 4 | 0 |
| | 36114 | 4 | 6 | 8 | 6 | 0 | 0 | 0 | 0 | 0 |
| | 36115 | 0 | 6 | 6 | 8 | 4 | 0 | 0 | 4 | 0 |
| | 36116 | 0 | 6 | 6 | 6 | 5 | 6 | 6 | 5 | 0 |
| | 36121 | 0 | 0 | 0 | 6 | 5 | 6 | 6 | 5 | 0 |
| | 36122 | 0 | 0 | 0 | 8 | 4 | 8 | 6 | 4 | 0 |
| | 36123 | 4 | 0 | 0 | 6 | 0 | 6 | 8 | 0 | 0 |
| | 36124 | 0 | 0 | 0 | 6 | 4 | 8 | 6 | 4 | 0 |
| | 36125 | 4 | 0 | 0 | 6 | 0 | 6 | 8 | 0 | 0 |
| | 36126 | 5 | 0 | 0 | 6 | 0 | 6 | 6 | 0 | 0 |
| ERASE | ALL | FLOAT | 7 | 7 | FLOAT | FLOAT | 7 | 7 | FLOAT | $-7$ |
| READ | 36111 | 0 | 3.5 | 6 | 6 | 2 | 0 | 0 | 2 | 0 |
| | 36112 | 2 | 3.5 | 4.5 | 6 | 0 | 0 | 0 | 0 | 0 |
| | 36113 | 0 | 4.5 | 3.5 | 6 | 2 | 0 | 0 | 2 | 0 |
| | 36114 | 2 | 6 | 3.5 | 4.5 | 2 | 0 | 0 | 2 | 0 |
| | 36115 | 0 | 6 | 4.5 | 3.5 | 0 | 0 | 0 | 0 | 0 |
| | 36116 | 2 | 6 | 6 | 3.5 | 2 | 6 | 6 | 2 | 0 |
| | 36121 | 2 | 0 | 0 | 3.5 | 0 | 4.5 | 6 | 0 | 0 |
| | 36122 | 2 | 0 | 0 | 3.5 | 2 | 3.5 | 4.5 | 2 | 0 |
| | 36123 | 0 | 0 | 0 | 4.5 | 0 | 3.5 | 3.5 | 0 | 0 |
| | 36124 | 2 | 0 | 0 | 6 | 2 | 4.5 | 3.5 | 2 | 0 |
| | 36125 | 2 | 0 | 0 | 6 | 0 | 6 | 4.5 | 0 | 0 |
| | 36126 | 0 | 0 | 0 | 6 | 2 | 6 | 6 | 2 | 0 |

FIG. 41

| | CHARGE STORAGE REGION | BL1 3962 | GL1 3942 | GL2 3944 | BL2 3964 | GL3 3946 | BL3 3966 | BL4 3968 | GL4 3948 | GL5 3949 | BL5 3969 | SUBSTRATE 12 |
|---|---|---|---|---|---|---|---|---|---|---|---|---|
| PROGRAM | 39111 | 6 | 6 | 6 | FLOAT | 10 | 0 | FLOAT | 0 | 0 | 0 | 0 |
| | 39112 | 4 | 8 | 6 | FLOAT | 10 | 0 | FLOAT | 0 | 0 | 0 | 0 |
| | 39113 | 0 | 6 | 8 | FLOAT | 10 | 5 | FLOAT | 0 | 0 | 5 | 0 |
| | 39114 | 0 | 6 | 6 | FLOAT | 10 | 6 | FLOAT | 0 | 0 | 6 | 0 |
| | 39121 | 6 | 10 | 10 | FLOAT | 6 | 0 | FLOAT | 0 | 0 | 0 | 0 |
| | 39122 | 0 | 10 | 10 | FLOAT | 6 | 6 | FLOAT | 0 | 0 | 6 | 0 |
| | 39131 | 0 | 0 | 0 | FLOAT | 6 | 0 | FLOAT | 10 | 10 | 0 | 0 |
| | 39132 | 0 | 0 | 0 | FLOAT | 6 | 6 | FLOAT | 10 | 6 | 6 | 0 |
| | 39141 | 0 | 0 | 0 | FLOAT | 10 | 5 | FLOAT | 6 | 6 | 5 | 0 |
| | 39142 | 4 | 0 | 0 | FLOAT | 10 | 0 | FLOAT | 8 | 6 | 0 | 0 |
| | 39143 | 4 | 0 | 0 | FLOAT | 10 | 0 | FLOAT | 6 | 6 | 0 | 0 |
| | 39144 | 6 | 0 | 0 | FLOAT | 10 | 0 | FLOAT | 6 | 6 | 0 | 0 |
| ERASE | ALL | FLOAT | 7 | 7 | FLOAT | 7 | FLOAT | FLOAT | 7 | 7 | FLOAT | −7 |
| READ | 39111 | 0 | 3.5 | 6 | FLOAT | 8 | 3 | FLOAT | 0 | 0 | 3 | 0 |
| | 39112 | 3 | 3.5 | 4.5 | FLOAT | 8 | 0 | FLOAT | 0 | 0 | 0 | 0 |
| | 39113 | 0 | 4.5 | 3.5 | FLOAT | 8 | 3 | FLOAT | 0 | 0 | 3 | 0 |
| | 39114 | 3 | 6 | 3.5 | FLOAT | 8 | 3 | FLOAT | 0 | 0 | 0 | 0 |
| | 39121 | 0 | 8 | 8 | FLOAT | 3.5 | 3 | FLOAT | 0 | 0 | 3 | 0 |
| | 39122 | 3 | 8 | 8 | FLOAT | 3.5 | 0 | FLOAT | 0 | 0 | 0 | 0 |
| | 39131 | 3 | 0 | 0 | FLOAT | 3.5 | 3 | FLOAT | 8 | 8 | 3 | 0 |
| | 39132 | 0 | 0 | 0 | FLOAT | 3.5 | 0 | FLOAT | 8 | 8 | 0 | 0 |
| | 39141 | 3 | 0 | 0 | FLOAT | 8 | 3 | FLOAT | 3.5 | 6 | 3 | 0 |
| | 39142 | 0 | 0 | 0 | FLOAT | 8 | 0 | FLOAT | 3.5 | 4.5 | 0 | 0 |
| | 39143 | 3 | 0 | 0 | FLOAT | 8 | 3 | FLOAT | 4.5 | 3.5 | 3 | 0 |
| | 39144 | 0 | 0 | 0 | FLOAT | 8 | 3 | FLOAT | 6 | 3.5 | 3 | 0 | ically completed.

ELECTRONIC DEVICE INCLUDING A MEMORY ARRAY AND CONDUCTIVE LINES

CROSS-REFERENCE TO RELATED APPLICATIONS

This is a divisional application of and claims priority under 35 U.S.C. § 120 to U.S. patent application Ser. No. 11/188,898 entitled "Electronic Device Including a Memory Array and Conductive Lines," by Yater et al., filed Jul. 25, 2005, and is related to U.S. patent application Ser. No. 11/188,953 entitled "Electronic Device Including Discontinuous Storage Elements and a Process For Forming The Same" by Yater et al. filed on Jul. 25, 2005, both of which are assigned to the current assignee hereof and incorporated herein by reference in their entirety.

BACKGROUND

1. Field of the Disclosure

The present invention relates to electronic devices, and more particularly, to electronic devices including memory arrays and processes for operating the memory arrays.

2. Description of the Related Art

Floating gate non-volatile memories ("FG NVM") are conventional and are commonly used in many applications. The three most common types of programming mechanisms for FG NVM include Fowler-Nordheim tunneling, conventional hot carrier injection ("HCI"), and source-side injection ("SSI"). Fowler-Nordheim tunneling is efficient but is very slow. Efficiency can be measured by dividing the number of carriers that enter a floating gate or one or more other storage elements divided by the number of carriers that enter a memory cell having the floating or the other storage element(s). The latter number can be approximated by using the product of the programming current and the programming time.

Hot carrier injection can include conventional hot carrier injection ("HCI") and SSI. Both involve the generation of hot carriers, some of which are injected into the floating or the other storage element(s). In HCI when using a floating gate, an electrical field is generated along a channel region of a memory cell. Within the channel region, the electrical field is the highest near the drain region. The electrical field accelerates carriers flowing within the channel region, such that, within the channel region, the carriers are traveling the fastest near the drain region. A small fraction of carriers collide with silicon or one or more other atoms within the channel region, redirecting the energetic carriers to the floating gate or other charge storage element(s). An electrical field generated by a control gate electrode can help inject some of that small fraction of the hot carriers into the floating gate. Conventional hot carrier injection is inefficient and has high programming current.

SSI is a popular compromise, with respect to efficiency and programming current, between Fowler-Nordheim tunneling and HCI. With SSI, hot carriers are still generated, however, most of the hot carriers are generated within a portion of the channel region that is spaced apart from the drain region. Memory cells designed to be programmed by SSI are not without problems. Typically, the memory cells require one or more additional critical lithographic sequences and result in larger memory cells.

High density floating gate memories are becoming more difficult to fabricate in commercial volumes. As the thickness of the gate dielectric layer decreases, the likelihood of a pinhole or other defect extending through the thickness of the gate dielectric layer increases. Such a defect can cause an electrical short or leakage path between the substrate and the floating gate. The electrical short or leakage path can affect the voltage on the floating gate, and therefore, the memory cell may not be able to retain data. One or more materials may be used for the gate dielectric layer instead of silicon dioxide, however, such material(s) may have other issues, such as material compatibility with other materials used in the memory cell, require new equipment, increase manufacturing costs, etc.

BRIEF DESCRIPTION OF THE DRAWINGS

The invention is illustrated by way of example and not limitation in the accompanying figures.

FIG. 29 includes an illustration of a cross-sectional view of the workpiece of FIG. 28 after exposing the intervening layer.

FIGS. 30 through 41 includes circuit schematic diagrams, cross-sectional views of exemplary physical embodiments of the circuit schematic diagrams, and operating voltage tables for memory cell along a row within an NVM array.

Figure 1:
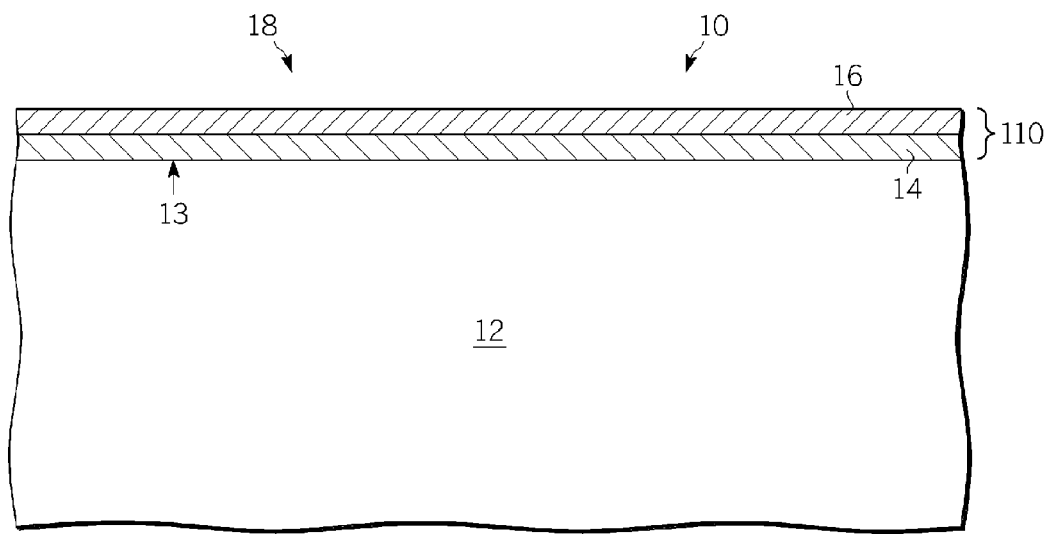
FIG. 1 includes an illustration of a cross-sectional view of a portion of a workpiece after formation of a protective layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

An electronic device can include discontinuous storage elements that lie within a trench. In one embodiment, the electronic device can include a substrate that includes a trench extending into a semiconductor material. The trench can include a ledge and a bottom, wherein the bottom lies at a depth deeper than the ledge. The electronic device can include discontinuous storage elements, wherein a trench portion of the discontinuous storage elements lies within the trench. In one embodiment, gate electrodes can lie adjacent to walls of the trench. In a particular embodiment, a portion of a channel region within a memory cell may not be covered by a gate electrode. The portion can allow a sufficient electrical field to be generated at that region to allow for SSI during programming. More than one bit may be stored within a single memory cell. In another embodiment, a doped region may underlie the ledge and allow for memory cells to be formed at different elevations within the trench. In other embodiment, a process can be used to form the electronic device.

A circuit can lie at least partly within a memory array that includes a first memory cell and a second memory cell. In one embodiment, source/drain regions of the first and second memory cells can be electrically connected to each other. The source/drain regions may electrically float regardless of direction in which carriers flow through channel regions of the memory cells. In another embodiment, the first memory cell can be electrically connected to a first gate line, and the second memory cell can be electrically connected to a greater number of gate lines as compared to the first memory cell. In one particular embodiment, all bit and gate line connections to a memory cell are oriented along a row or along a column, rather than a combination of rows and columns. In another aspect, the first and second memory cells are connected to the same bit line. Such bit line can electrically float when programming or reading the first memory cell or the second memory cell or any combination thereof. In one embodiment, the programming can be performed using conventional hot carrier injection or source-side injection. In any of the embodiments, the memory array can be a nonvolatile memory that includes nonvolatile memory cells. In other embodiments, each of the memory cells can include discontinuous storage elements.

Before addressing details of embodiments described below, some terms are defined or clarified. With respect to dimensions, depth refers to a dimension as measured in a direction substantially perpendicular to a primary surface of a substrate. Length and width refer to dimensions as measured in directions substantially perpendicular to each other and to the depth.

The term "discontinuous storage elements" is intended to mean spaced-apart objects capable of storing a charge. In one embodiment, substantially all discontinuous storage elements may be initially formed and remain separate from one another. In another embodiment, a substantially continuous layer of material formed an later separated into discontinuous storage elements. In yet another embodiment, substantially all discontinuous storage elements may be initially formed separate from one another, and later during the formation, some but not all of the discontinuous storage elements may coalesce.

The term "primary surface" is intended to mean a surface of a substrate from which memory cells within a memory array are subsequently formed. The primary surface may be an original surface of a substrate before forming any electronic components or may be a surface from which trenches or other permanent structures within the memory array are formed. For example, the memory array may be formed at least partly within an epitaxial layer overlying a base material, and electronic components within peripheral area (outside the memory array) may be formed from the base material. In this example, the primary surface refers to the upper surface of the epitaxial layer, and not the original surface of the base material.

The term "electrically float" is intended to mean a state wherein a bit line, a gate line, a gate electrode, a source/drain region, a source region, a drain region, a collector region, a base region, an emitter region, a well region, or any combination thereof is within an open circuit or is placed in a high impedance state such that no significant flows within a circuit that would include such bit line, gate line, gate electrode, source/drain region, source region, drain region, collector region, base region, emitter region, well region, or any combination.

The term "stack" is intended to mean a plurality of layers or a plurality of at least one layer and at least one structure (e.g., nanocrystals), wherein the plurality of layers or plurality of layer(s) and structure(s) provides an electronic function. For example, a non-volatile memory stack can include layers used to form at least part of a non-volatile memory cell. A stack may be part of a larger stack. For example, a non-volatile memory stack can include a charge storage stack that is used to store charge within a non-volatile memory cell.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

To the extent not described herein, many details regarding specific materials, processing acts, and circuits are conventional and may be found in textbooks and other sources within the semiconductor and microelectronic arts.

FIG. 1 includes an illustration of a cross-sectional view of a portion of electronic device 10, such as an integrated circuit. The integrated circuit can be a standalone memory, a microcontroller, or other integrated circuit that includes a memory. In one embodiment, electronic device 10 can include non-volatile memory ("NVM") array 18, a portion of which is illustrated in FIG. 1. Substrate 12 can include a monocrystalline semiconductor wafer, a semiconductor-on-insulator wafer, a flat panel display (e.g., a silicon layer over a glass plate), or other substrate conventionally used to form electronic devices. Although not illustrated, shallow trench field isolation may be formed over portions of substrate 12 in peripheral areas, which are outside the NVM array 18. A protective layer 110 can be formed over substrate 12. The protective layer 110 includes pad layer 14, overlying the substrate 12 and oxidation-resistant layer 16, over the pad layer 14. Protective layer 110 could have more or fewer layers than are illustrated. The surface of substrate 12 contacting pad layer 14 is primary surface 13. Protective layer 110 will remain over the peripheral areas until fabrication of NVM array 18 is substantially completed. In one embodiment, pad layer 14 includes oxide and oxidation-resistant layer 16 includes of nitride.

Figure 2:
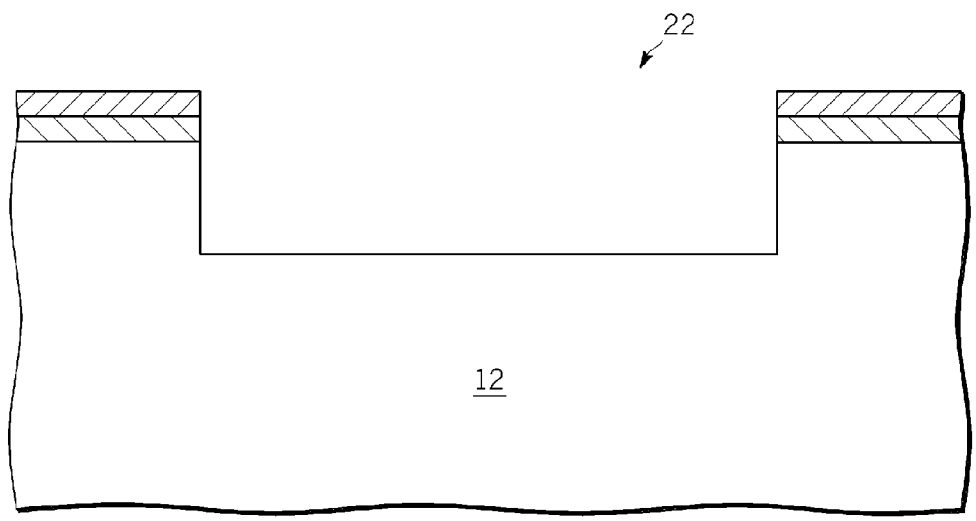
FIG. 2 includes an illustration of a cross-sectional view of the workpiece of FIG. 1 after formation of a portion of a trench.

A patterned resist layer, which includes openings at locations within NVM array 18 where trenches are to be formed (not illustrated), is formed over substrate 12 using a conventional lithographic technique. Protective layer 110 within the openings can be removed by a conventional technique to expose primary surface 13. In one embodiment, illustrated in FIG. 2, the upper portion of trench 22 is formed prior to removal of the patterned resist layer. In another embodiment, the patterned resist layer is removed and the upper portion of trench 22 can then formed by a conventional technique. The depth of the upper portion of trench 22, at least in part, determines the channel length of the memory cells that lie adjacent to trench 22. In one embodiment the depth of this portion of trench 22 is in a range of approximately 50 to approximately 500 nm. In one particular embodiment, the upper portion of trench 22 is formed using a conventional, timed, anisotropic etch to produce substantially vertical walls.

Figure 3:
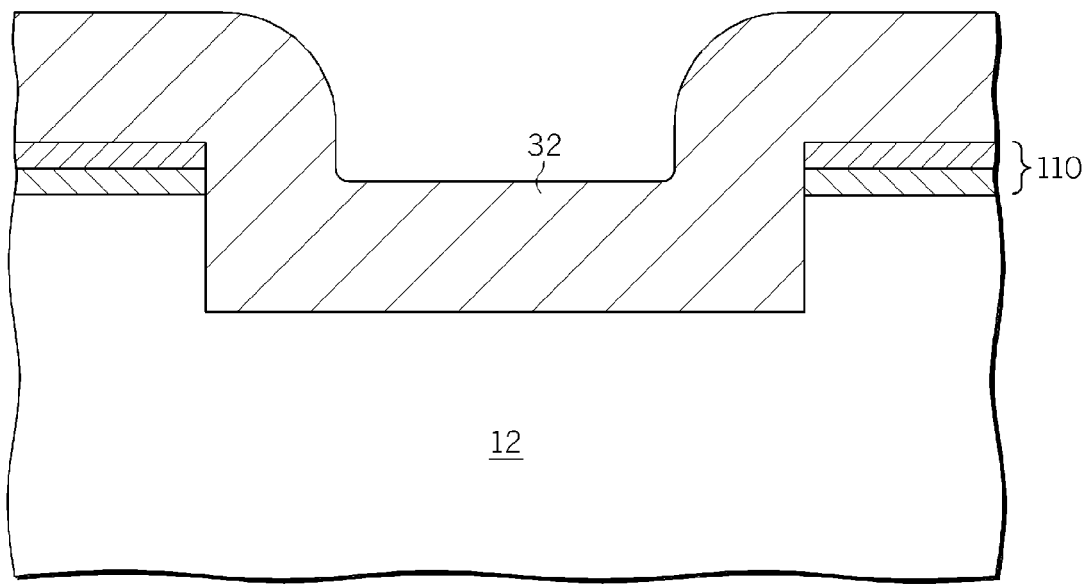
FIG. 3 includes an illustration of a cross-sectional view of a workpiece of FIG. 2 after formation of an overlying, insulating layer.

Layer 32 can then be formed over the workpiece by a conventional technique as illustrated in FIG. 3. Layer 32 can be a material different from substrate 12. In one embodiment, layer 32 can include one or more films of silicon dioxide, silicon nitride, silicon oxynitride, a metal, a metal alloy or any combination thereof. In one particular embodiment, layer 32 is substantially conformal. In another embodiment, the thickness of layer 32 is in a range of approximately 30 to approximately 300 nm thick.

Figure 4:
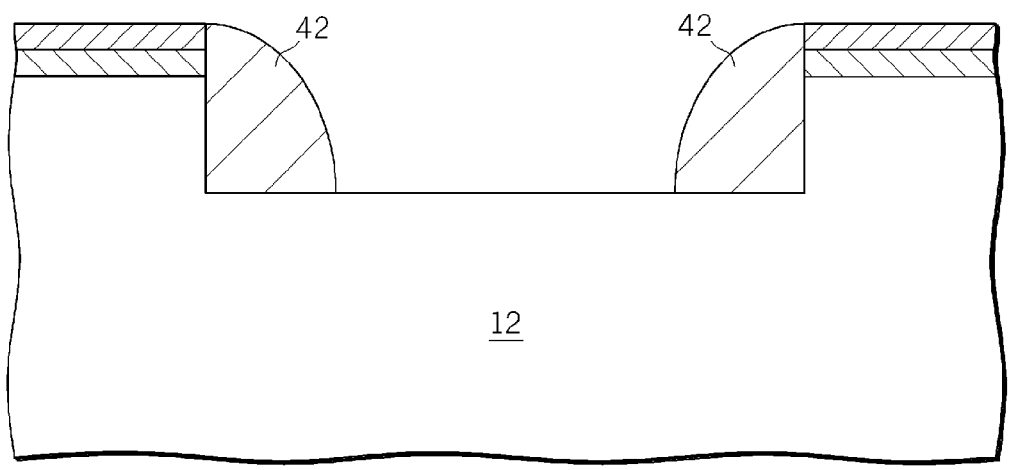
FIG. 4 includes an illustration of a cross-sectional view of a workpiece of FIG. 3 after formation of sidewall spacers.

Layer 32 can then be etched by a conventional technique to expose substrate 12 at the bottom of the upper portion of trench 22 as well as oxidation-resistant layer 16 to form sidewall spacer 42 as illustrated in FIG. 4. In one embodiment, sidewall spacer 42 is an annular structure within trench 22. In another embodiment, the etch process is anisotropic.

Figure 5:
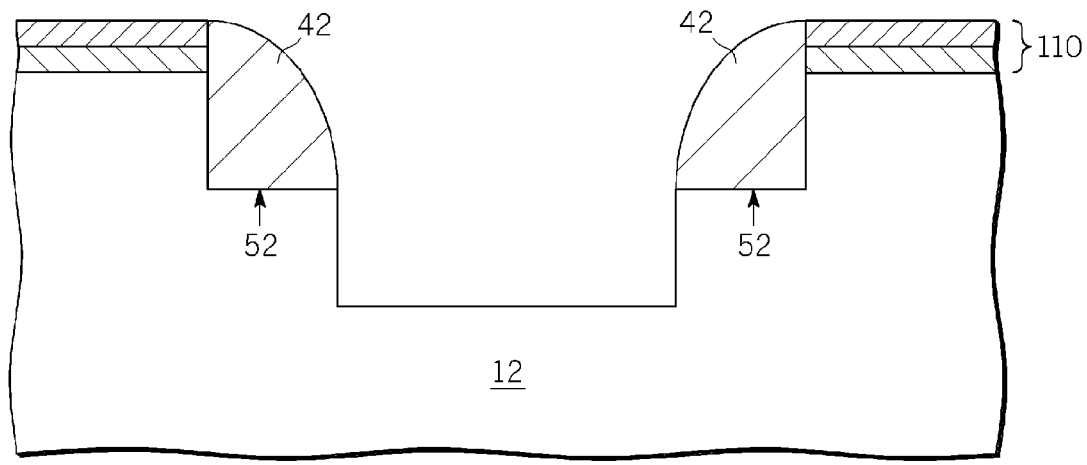
FIG. 5 includes an illustration of a cross-sectional view of a workpiece of FIG. 4 after formation of an additional portion of the trench.

Material is then removed from the exposed portion of substrate 12 at the bottom of the upper portion of trench 22 to form a lower portion of trench 22, as illustrated in FIG. 5. The etch process can remove in the range of approximately 50 to approximately 500 nm of additional substrate material. In one particular embodiment, the removal process is performed as a conventional, anisotropic etch such that lower portion of trench 22 is formed with substantially vertical walls. In another embodiment, lower portion of trench 22 is of substantially uniform depth with substantially no offset from the adjacent edge of the sidewall spacer 42. In one embodiment, the upper portion of trench 22 is wider than the lower portion of trench 22. In a particular embodiment, the upper portion of trench 22 is wider than the bottom portion of trench 22 by approximately twice the width of sidewall spacer 42. The bottom of the lower portion of trench 22 can now be considered the bottom of the trench 22. The remaining part of the bottom of upper portion of trench 22, currently overlaid by sidewall spacer 42, now forms ledge 52 within trench 22. In one particular embodiment, ledge 52 lie within substrate 12, below primary surface 13 and above the bottom of trench 22, and are connected to each by upper and lower walls, respectively.

Figure 6:
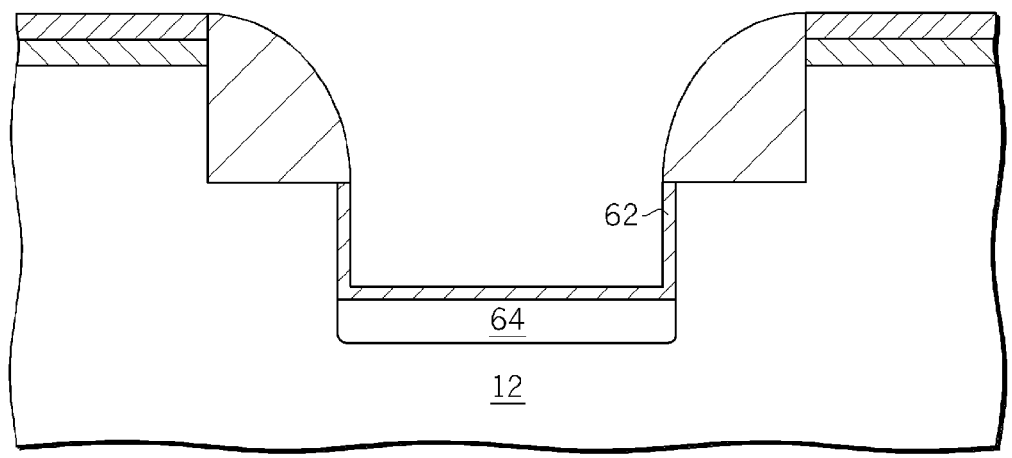
FIG. 6 includes an illustration of a cross-sectional view of the workpiece of FIG. 5 after formation of a doped region at the bottom of the trench.

Insulating layer 62 can then be formed on exposed portions of trench structures 42 as illustrated in FIG. 6. In one embodiment, the insulating layer may contain an oxide, a nitride, an oxynitride or any combination thereof. In one embodiment, insulating layer 62 can be used as an implant screen. In one particular embodiment, insulating layer 62 is formed by thermally oxidizing the exposed portions of the substrate 12 within trench 22. Thermal oxidation can be beneficial in removing defects, such as those induced by etching, help to round corners of trench 22, or a combination thereof. Corner rounding may help improve the integrity of subsequently-formed gate dielectric layers as compared to those formed over unrounded corners. In another embodiment (not illustrated), layer 32 can be deposited. If deposited, layer 32 would cover substantially all exposed surface of the workpiece. In one embodiment insulating layer 62 is substantially conformal. In another embodiment, insulating layer 62 is not more than approximately 20 nm thick.

A dopant is introduced into the portions of substrate 12 at the bottom of trench structure 22 to form doped region 64 within NVM array 18. The dopant may be a p-type dopant (e.g., boron) or an n-type dopant (e.g., phosphorus or arsenic). In one embodiment, the dopant can be introduced using ion implantation. An optional thermal cycle can be performed to activate the dopant. In another embodiment, subsequent processing may have one or more thermal cycles capable of activating the dopant. In one embodiment, the doped region 64 can act as a source/drain ("S/D") region for the finished electronic device 10. The doping concentration of the doped regions 62 is at least approximately 1E19 atoms/cm$^3$ in a finished electronic device 10.

Figure 7:
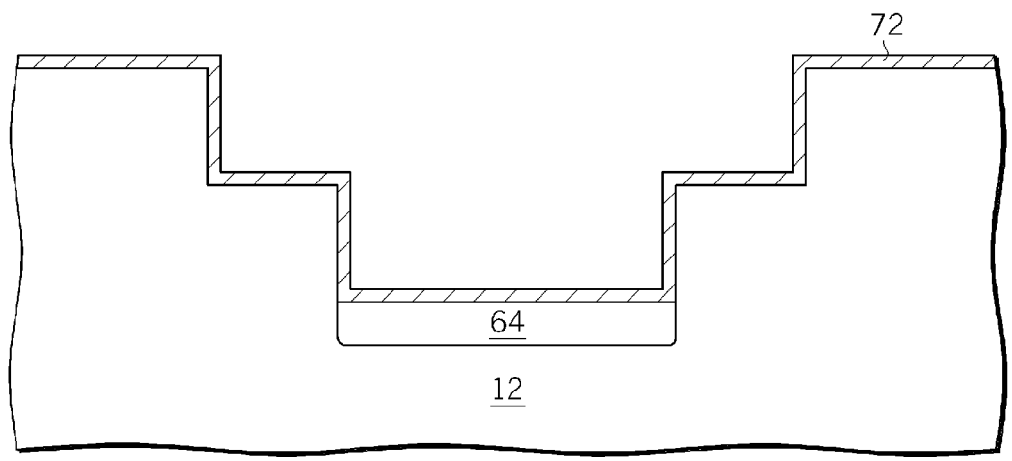
FIG. 7 includes an illustration of a cross-sectional view of the workpiece of FIG. 6 after removal of features overlying the substrate and formation of a dielectric layer.

Sidewall spacer 42, insulating layer 62 and the remaining portions of protective layer 110 within NVM array 18 are then removed by one or more conventional etching techniques. Portions of different layers may be removed as they are exposed. In one embodiment, the removal process sequence is selected to reduce damage to the underlying substrate surface. In another embodiment, the removal process sequence is selected to reduce the number of processing steps. Optionally, a sacrificial layer 72 may be formed, as illustrated in FIG. 7, and subsequently removed. In one particular embodiment, the sacrificial layer 72 is a thermally grown oxide having a thickness of not more than approximately 50 nm.

Figure 8:
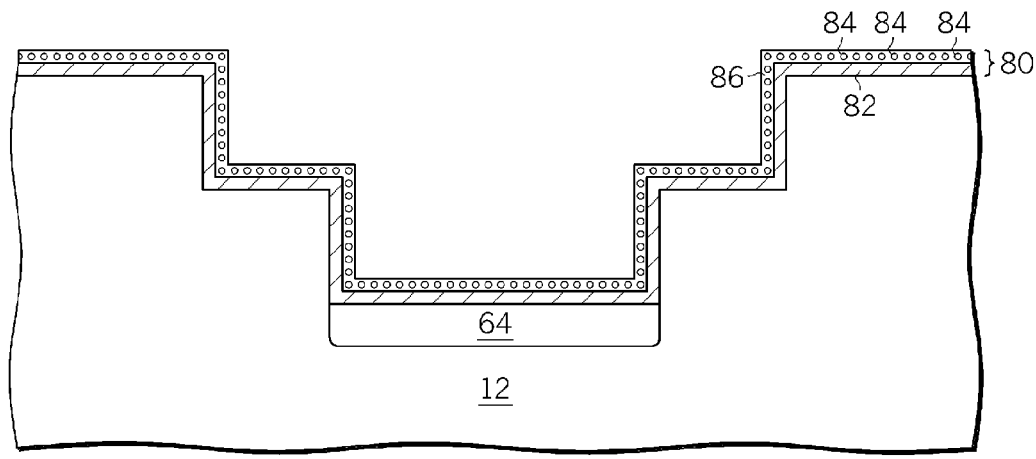
FIG. 8 includes an illustration of a cross-sectional view of a workpiece of FIG. 7 after formation of a charge storage layer.

Charge storage stack 80, including dielectric layer 82, discontinuous storage elements 84, and dielectric layer 86 can then be formed, as illustrated in FIG. 8. Dielectric layer 82 may be thermally grown using an oxidizing or nitridizing ambient, or deposited using a conventional chemical vapor deposition technique, physical vapor deposition technique, atomic layer deposition technique, or a combination thereof. Dielectric layer 82 can include one or more films of silicon dioxide, silicon nitride, silicon oxynitride, a high dielectric constant ("high-k") material (e.g., dielectric constant greater than 8), or any combination thereof. The high-k material can include $Hf_aO_bN_c$, $Hf_aSi_bO_c$, $Hf_aSi_bO_cN_d$, $Hf_aZr_bO_cN_d$, $Hf_aZr_bSi_cO_dN_e$, $Hf_aZr_bO_c$, $Zr_aSi_bO_c$, $Zr_aSi_bO_cN_d$, $ZrO_2$, other Hf-containing or Zr-containing dielectric material, a doped version of any of the foregoing (lanthanum doped, niobium doped, etc.), or any combination thereof. Dielectric layer 82 can have a thickness in a range of approximately 1 to approximately 10 nm. The thickness and material selection of dielectric layer 82 will substantially determine its electrical properties. In one embodiment the thickness and material are chosen such that dielectric layer 82 has a silicon dioxide equivalent thickness of less than 10 nm.

Discontinuous storage elements 84 are then formed over NVM array 18. Discontinuous storage elements 84 can be formed on exposed portions of NVM array 18. In one embodiment, one portion of discontinuous storage elements 84 lies at least within trench 22. In another embodiment, one portion of discontinuous storage elements 84 lies adjacent to the wall of the upper portion of trench 22 and another portion lies adjacent to the wall of the lower portion of trench 22. In another embodiment discontinuous storage elements 84 can overlie the primary surface 13 outside of trench 22. The discontinuous storage elements 84 are substantially physically separated one from another.

Discontinuous storage elements 84 can include a material capable of storing a charge, such as silicon, a nitride, a metal-containing material, another suitable material capable of storing charge, or any combination thereof. For example, discontinuous storage elements 84 can include silicon nanocrystals or metal nanoclusters. In one particular embodiment, a substantially continuous layer of amorphous silicon can be deposited over exposed surfaces of substrate 12. The substantially continuous layer can be exposed to heat or other processing conditions that can cause the layer to "ball up" or otherwise form silicon nanocrystals. Discontinuous storage elements 84 may be undoped, doped during deposition, or doped after deposition. In one embodiment, discontinuous storage elements 84 can be formed from one or more materials whose properties are not significantly adversely affected during a thermal oxidation process. Such a material can include platinum, palladium, iridium, osmium, ruthenium, rhenium, indium-tin, indium-zinc, aluminum-tin, or any combination thereof. Each of such materials, other than platinum and palladium, may form a conductive metal oxide. In one embodiment, each of discontinuous storage elements 84 is no greater than approximately 10 nm in any dimension. In another embodiment, discontinuous storage elements 84 can be larger, however, discontinuous storage elements 84 are not formed so large as to form a continuous structure (i.e., all discontinuous storage elements 84 are not fused together).

Dielectric layer 86 is then formed over discontinuous storage elements 84. Dielectric layer 86 can include one or more dielectric films. Dielectric layer 86 can include any one or more materials or be formed using any of the embodiments as described with respect to dielectric 82 layer. Dielectric layer 86 can have the same or different composition compared to dielectric 82 layer and may be formed using the same or different formation technique compared to dielectric layer 82.

Figure 9:
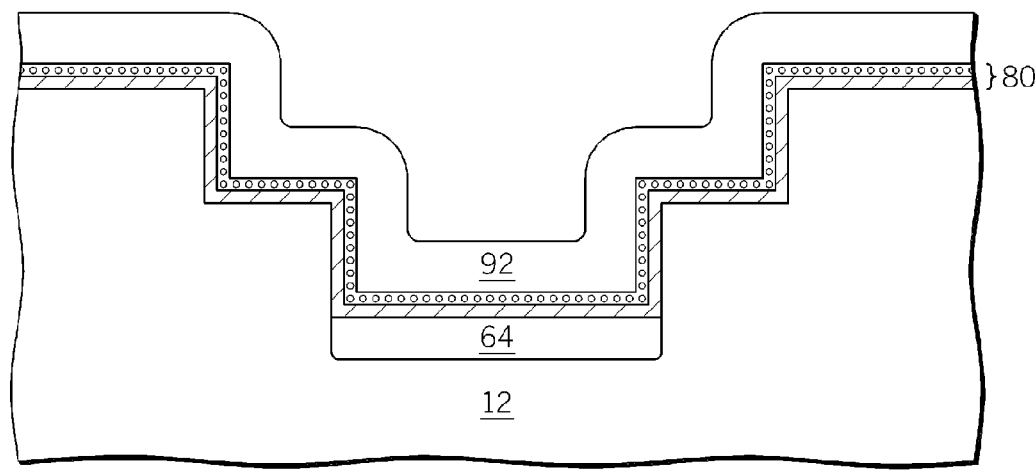
FIG. 9 includes an illustration of a cross-sectional view of a workpiece of FIG. 8 after formation of an overlying, conducting layer.

Conductive layer 92 is then formed over the charge storage stack 80 as illustrated in FIG. 9. The conductive layer 92 can include one or more semiconductor-containing or metal-containing films. In one embodiment, the conductive layer 92 includes polysilicon or amorphous silicon deposited by a chemical vapor deposition process, but may include other materials or may be deposited by other processes in other embodiments. In one embodiment, the conductive layer 92 is doped when deposited, and in another embodiment, is doped after it is deposited. The thickness of the conductive layer 92 is insufficient to fill trench 22. In one embodiment, the thickness of the conductive layer 92 is in a range of approximately 20 to approximately 200 nm. In another embodiment, the conductive layer 92 has a dopant concentration of at least approximately 1E19 atoms/cm3 when the conductive layer 92 includes polysilicon or amorphous silicon.

Figure 10:
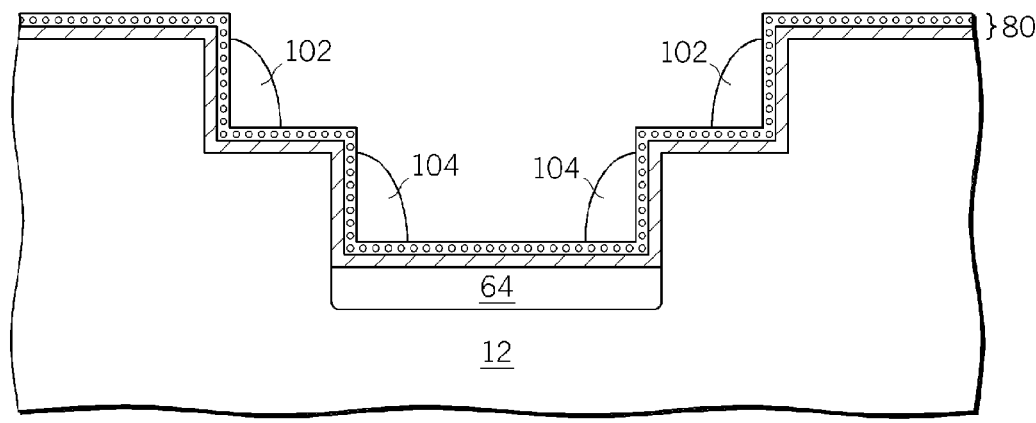
FIG. 10 includes an illustration of a cross-sectional view of a workpiece of FIG. 9 after formation of sidewall spacers.

Portions of conductive layer 92 are removed to form a structure 102 and a gate electrode 104, as illustrated in FIG. 10. In one embodiment, the portions of conductive layer 92 are removed using a conventional etch technique. In a particular embodiment, the width of structure 102 is narrower than ledge 52 and exposes portions of charge storage stack 80 overlying ledge 52. In one embodiment, the widths of structure 102 and gate electrode 104 are substantially the same as the thickness of the conductive layer 92, as deposited over primary surface 13.

Figure 11:
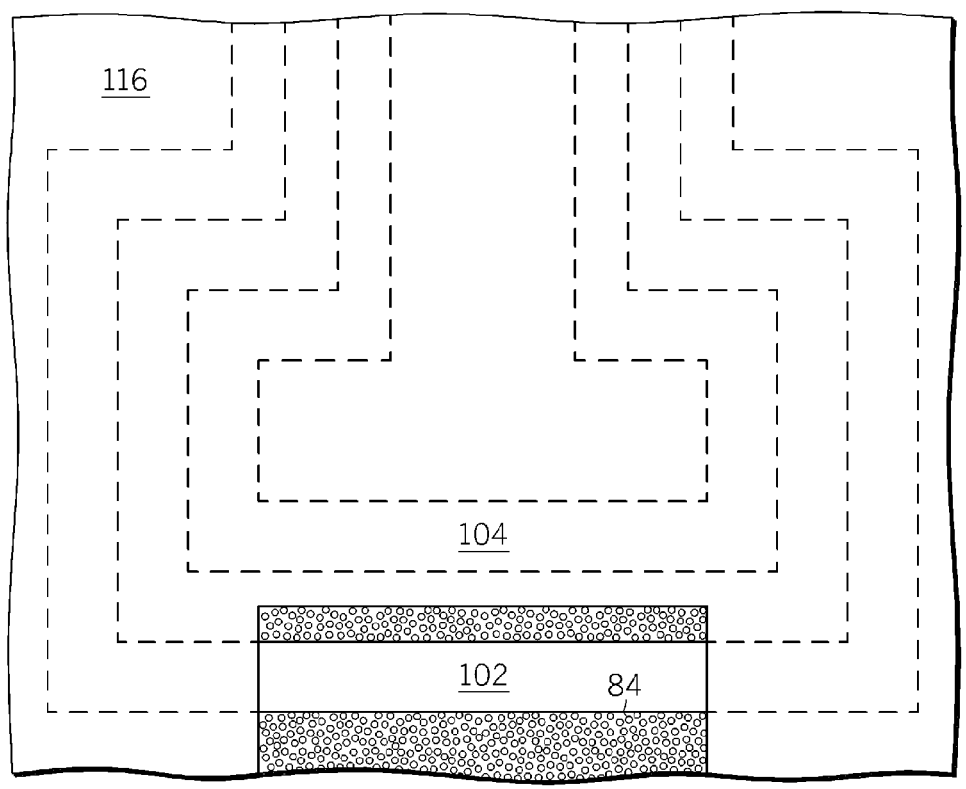
FIG. 11 includes an illustration of a top view of an embodiment of an end of a trench of the workpiece in FIG. 10, overlaid with patterned resist.
Figure 12:
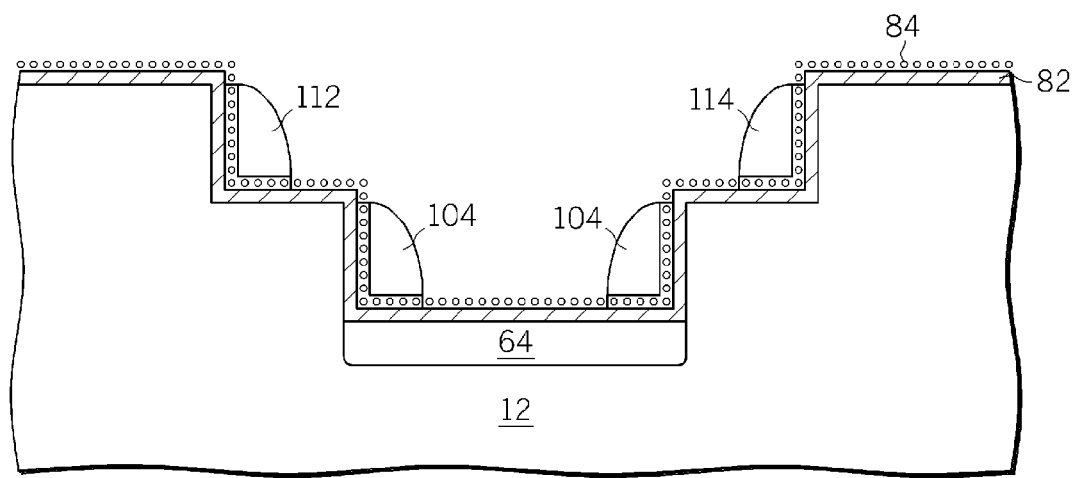
FIG. 12 includes an illustration of a cross-sectional view of the workpiece of FIG. 11 after separation of the top sidewall spacer into gate electrodes and removal of exposed portions of the top layer of dielectric from the charge storage stack.

In one embodiment, resist layer 116 is formed by a conventional technique, such that a portion of structure 102 at each end of trench 22 is exposed. One of the exposed portions of structure 102 is illustrated in FIG. 11. In FIG. 11, and other top views, some overlying dielectric or insulating layers are not illustrated to simplify understanding of positional relationships between features within NVM array 18. In a particular embodiment, the exposed portions of structure 102 can then be removed by a conventional technique to form gate electrodes 112 and 114 that are electrically separated from each other. FIG. 12 includes a cross-sectional view illustrating the locations of gate electrodes 112 and 114. Resist layer 116 can then be removed by a conventional ashing technique.

Figure 13:
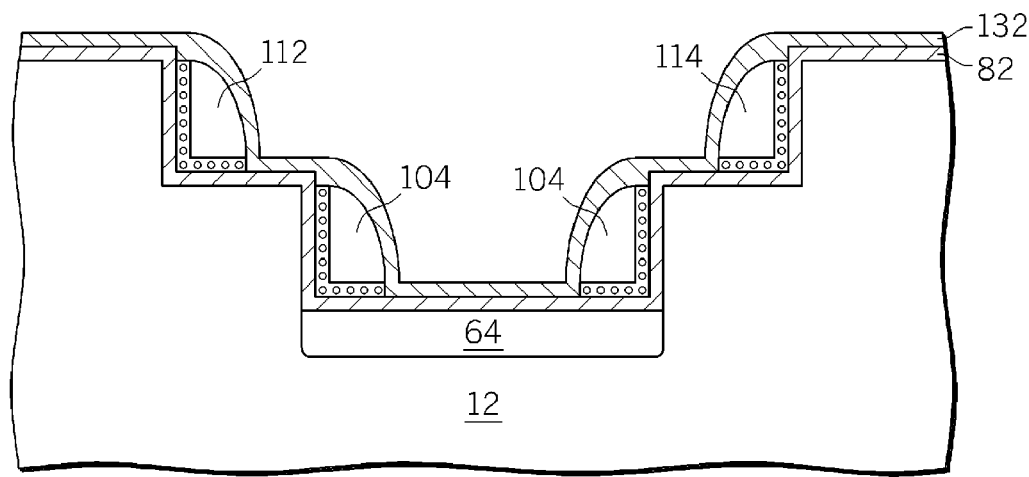
FIG. 13 includes an illustration of a cross-sectional view of the workpiece of FIG. 12 after formation of an insulating layer.

Exposed portions of interlevel dielectric 86 are then removed to expose a portion of discontinuous storage elements 84 and portions of underlying gate dielectric 82, as illustrated in FIG. 12. Exposed discontinuous storage elements 84 can then be removed or otherwise rendered incapable of storing charge. Insulating layer 132 is then formed over NVM array 18, as illustrated in FIG. 13. Insulating layer 132 can include one or more dielectric films, any of which may be thermally grown or deposited. Insulating layer 132 can include any one or more materials or be formed using any of the embodiments as described with respect to dielectric 82 layer. Insulating layer 132 can have the same or different composition compared to dielectric 82 layer and may be formed using the same or different formation technique compared to dielectric layer 82. In one embodiment, the workpiece is thermally oxidized to form insulating layer 132. In a particular embodiment, the exposed discontinuous storage elements 84 are oxidized to become part of insulating layer 132. In another embodiment (not illustrated), a wet etch undercuts exposed discontinuous storage elements 84 allowing them to be rinsed away. In one particular embodiment, discontinuous storage elements 84 are silicon crystals that are oxidized to form silicon dioxide. In one embodiment, at this point in the process, substantially no exposed discontinuous storage elements 84 remain. After forming insulating layer 132, optional spacer structures (not illustrated) may be formed adjacent to gate electrodes 104, 112, or 114.

In one embodiment, the memory cell structure of NVM array 18 is now substantially complete other than source/drain ("S/D") regions and electrical connections. Although not illustrated, other memory cells, including other trenches, other features, and other portions of layers, are formed in NVM array 18 and are substantially the same as illustrated in FIG. 13. Remaining portions of protective layer 110 (not illustrated) that overlie the peripheral areas of substrate 12 are removed, and another protective layer (not illustrated) can be formed over NVM array 18 which may protect NVM array 18 during component fabrication within the peripheral areas. Component fabrication within the peripheral areas can be performed using one or more conventional techniques. The peripheral areas can include one or more bit line control modules, one or more gate line modules, other suitable one or more circuits or logic, or any combination thereof. The bit line and gate line control modules, as described in more detail below, can lie outside and near a perimeter of NVM array 18. After the component fabrication within the peripheral areas is substantially completed, the protective layer overlying NVM array 18 can be removed. The remainder of the processing can be used for NVM array 18 and the peripheral areas of the electronic device.

Figure 14:
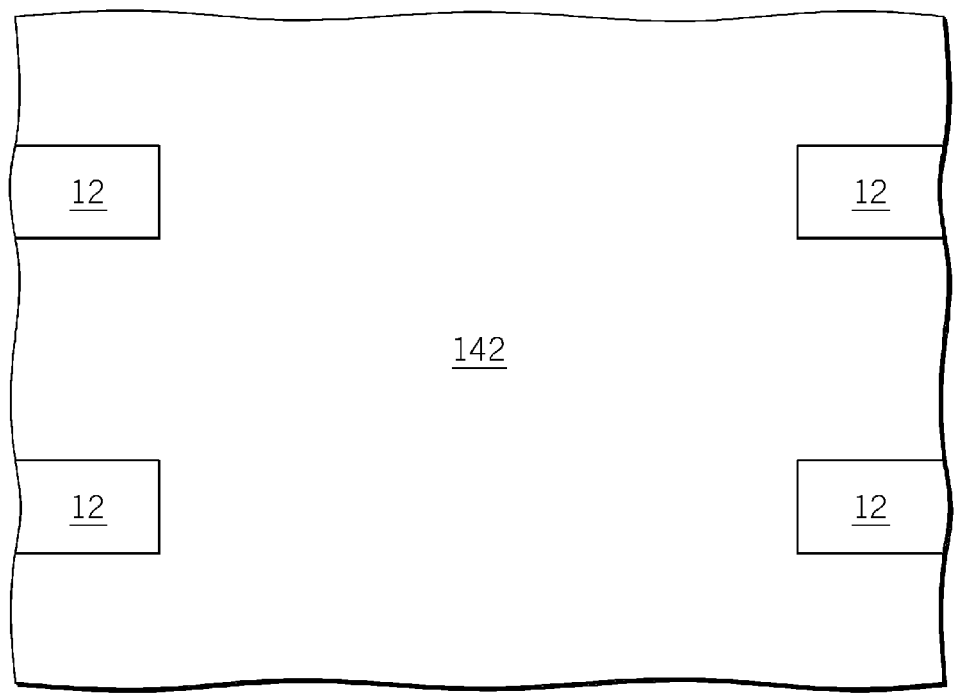
FIG. 14 includes an illustration of a top view of the workpiece of FIG. 13 after formation of a patterned resist layer.
Figure 15:
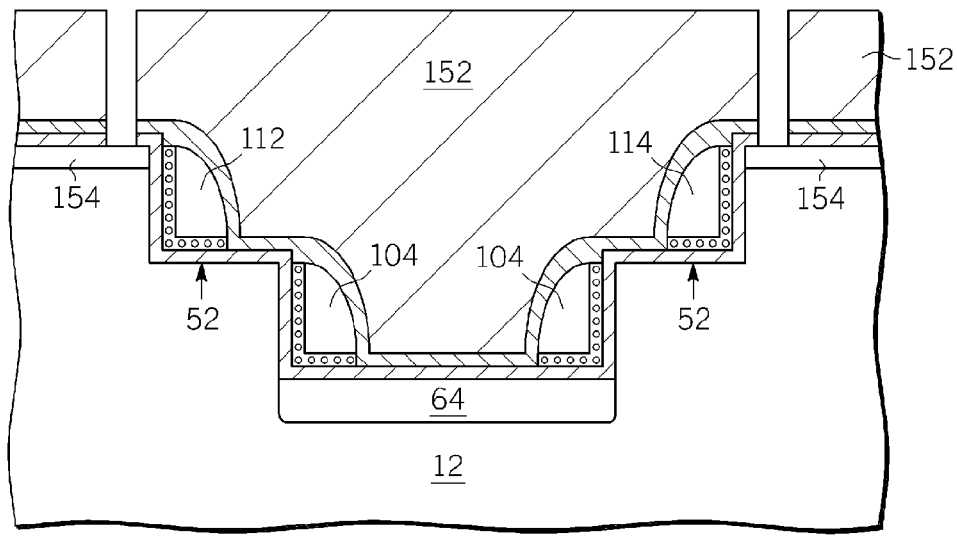
FIG. 15 includes an illustration of a cross-sectional view of the workpiece of FIG. 14 after formation of an insulating layer with contact openings.

A resist layer 142 is formed with opening overlying portions of substrate 12 external to the trenches, that will underlie subsequently formed bit lines, as illustrated in top view in FIG. 14. A dopant is introduced to substrate 12. The dopant can include one or more materials or be formed using any of the embodiments previously described with respect to doped region 64. The dopant can be the same or different composition than the one used to form doped region 64 and may be formed by the same or different formation technique compared to doped region 64. Further processing results in formation of doped region 154, as illustrated in FIG. 15. In one embodiment, doped regions 154 can act as S/D regions for the memory cells illustrated in FIG. 15.

Interlevel dielectric layer 152 can be formed by conventional techniques and can have contact openings that extend to doped region 154 of substrate 12 and to other portions of electronic device 10. Interlevel dielectric layer 152 can include an insulating material, such as an oxide, a nitride, an oxynitride, or a combination thereof. In a particular embodiment, an anisotropic etch can be used to form the contact openings.

Figure 16:
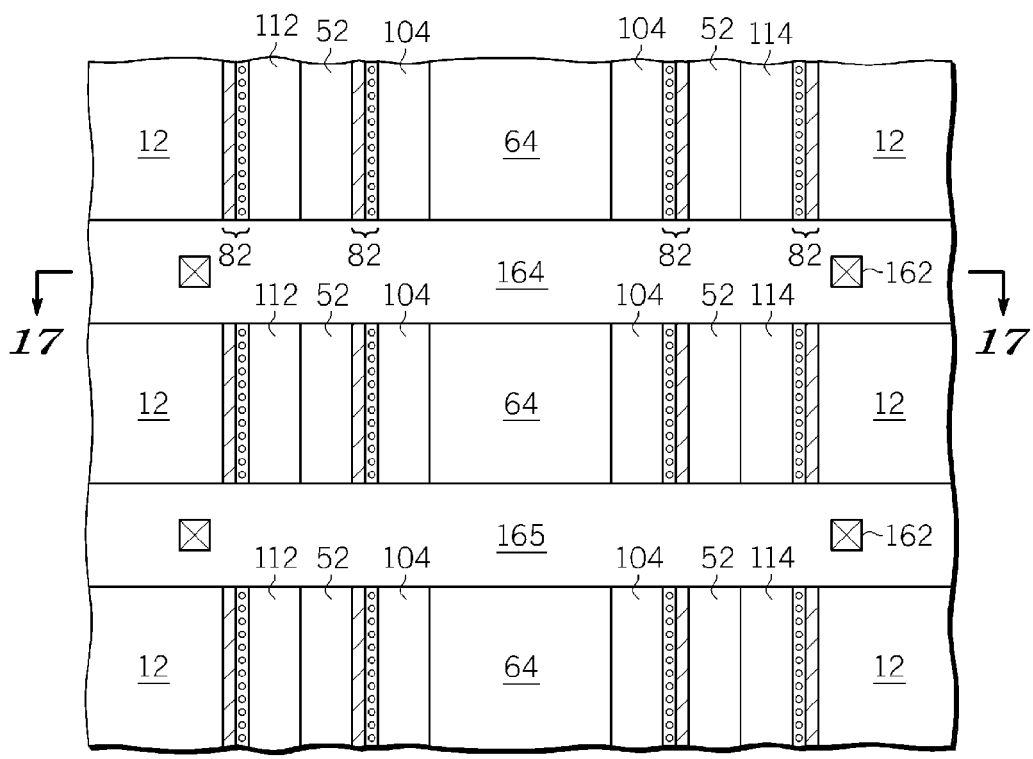
FIGS. 16 and 17 include illustrations of a top view and a cross-sectional view, respectively, of the workpiece of FIG. 15 after formation of conducting lines and an insulating layer.

Conductive plugs 162 and conductive lines 164 and 165 are then formed, as illustrated in FIG. 16. The lengths of conductive lines 164 and 165 are substantially perpendicular to the length of trench 22. In one embodiment, conductive lines 164 and 165 are bit lines for NVM array 18, and conductive plugs 162 are bit line contacts. Referring to FIG. 16, portions of substrate 12 are illustrated lying between conductive lines 164 and 165. Although not illustrated in FIG. 16, doped regions 154 underlie conductive lines 164 and 165 between portions of substrate 12.

In one embodiment, conductive plugs 162 are formed prior to conductive lines 164 and 165. In one particular embodiment, a conductive layer (not illustrated) is formed over interlevel dielectric layer 152 and substantially fills contact openings therein. Portions of the conductive layer that lie outside the contact openings are removed to form conductive plugs 162. In one embodiment, a conventional chemical-mechanical polishing operation can be performed, and in another embodiment, a conventional etching process can be performed.

Another insulating layer (not illustrated) is then deposited and patterned to form trenches where conductive lines 164 and 165 will subsequently be formed. Other trenches can be formed at locations within NVM array 18, outside NVM array 18, or a combination thereof. In one embodiment, another conductive layer is formed over interlevel dielectric layer 152 and substantially fills the trenches in the insulating layer. Portions of the conductive layer that lie outside the trenches within the insulating layer are removed to form conductive lines 164 and 165. In one embodiment, a conventional chemical-mechanical polishing operation can be performed, and in another embodiment, a conventional etching process can be performed. Although not illustrated in FIGS. 16 and 17, the insulating layer can lie at substantially the same elevation between conductive lines 164 and 165. In another embodiment (not illustrated), conductive plugs 162 and conductive lines 164 and 165 are formed concurrently using a conventional dual-inlaid process.

Conductive plugs 162 and conductive lines 164 and 165 can include the same or different conducting materials. Each of conductive plugs 162 and conductive lines 164 and 165 can include doped silicon, tungsten, titanium, tantalum, titanium nitride, tantalum nitride, aluminum, copper, other suitable conductive material, or any combination thereof. In one particular embodiment, conductive plugs 162 include tungsten, and conductive lines 164 and 165 include copper. An optional barrier layer, adhesion layer, or a combination thereof may be formed before the corresponding conductive layers (e.g., tungsten for conductive plugs 162 and copper for conductive lines 164 and 165). An optional capping layer (e.g., a metal-containing nitride) may be used to encapsulate copper within conductive lines 164 and 165.

Figure 17:
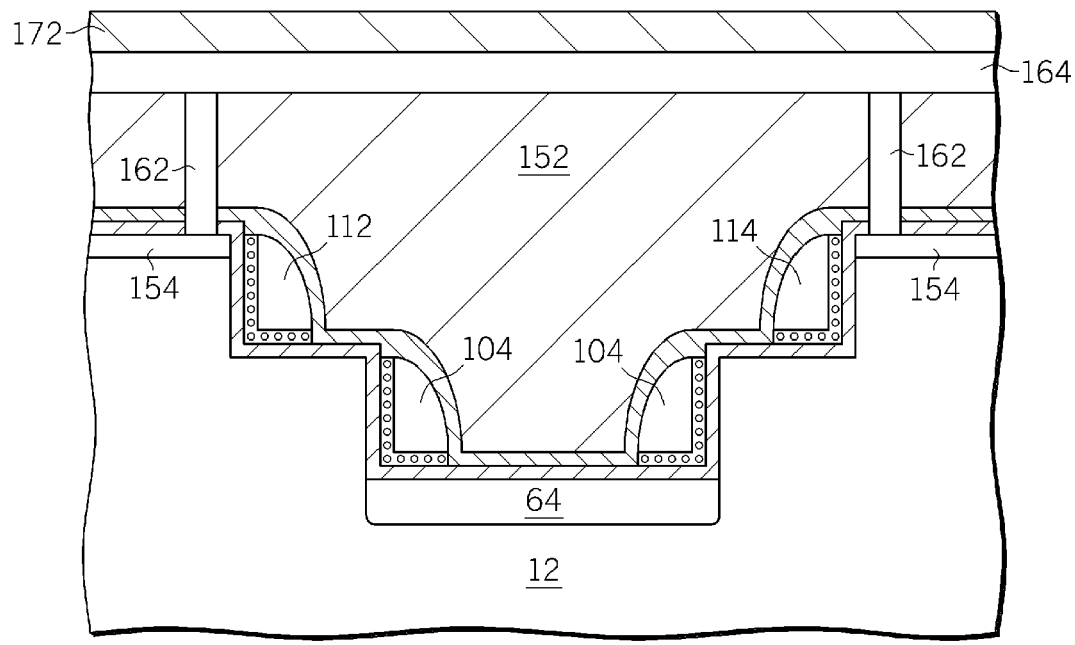

In another embodiment (not illustrated), additional insulating and conductive layers can be formed and patterned to form one or more additional levels of interconnects. After the last interconnect level has been formed, passivation layer 172 is formed over substrate 12, including NVM array 18 and peripheral areas, as illustrated in FIG. 17. Passivation layer 172 can include one or more insulating film, such as an oxide, a nitride, an oxynitride, or a combination thereof.

Figure 18:
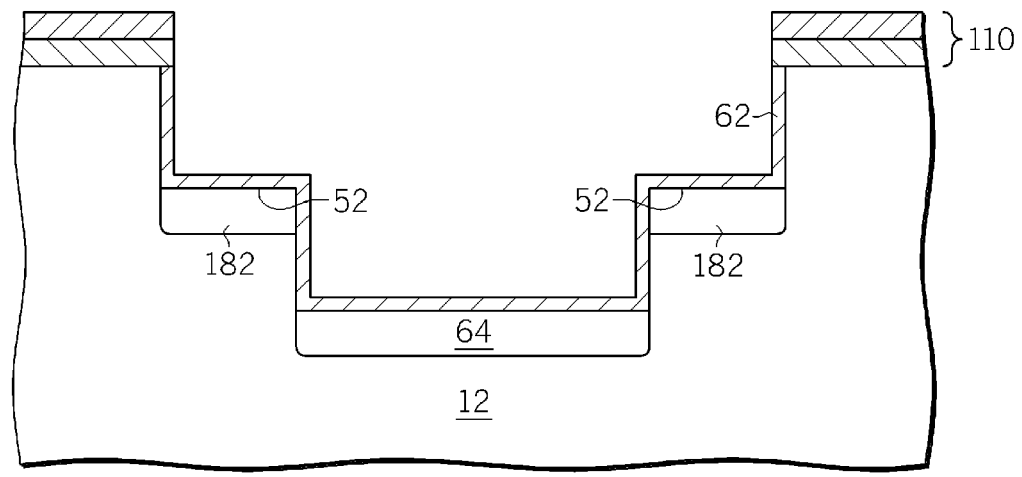
FIG. 18 includes an illustration of a cross-sectional view of the workpiece of FIG. 5 after formation of doped regions, as described in accordance with an alternative embodiment.
Figure 19:
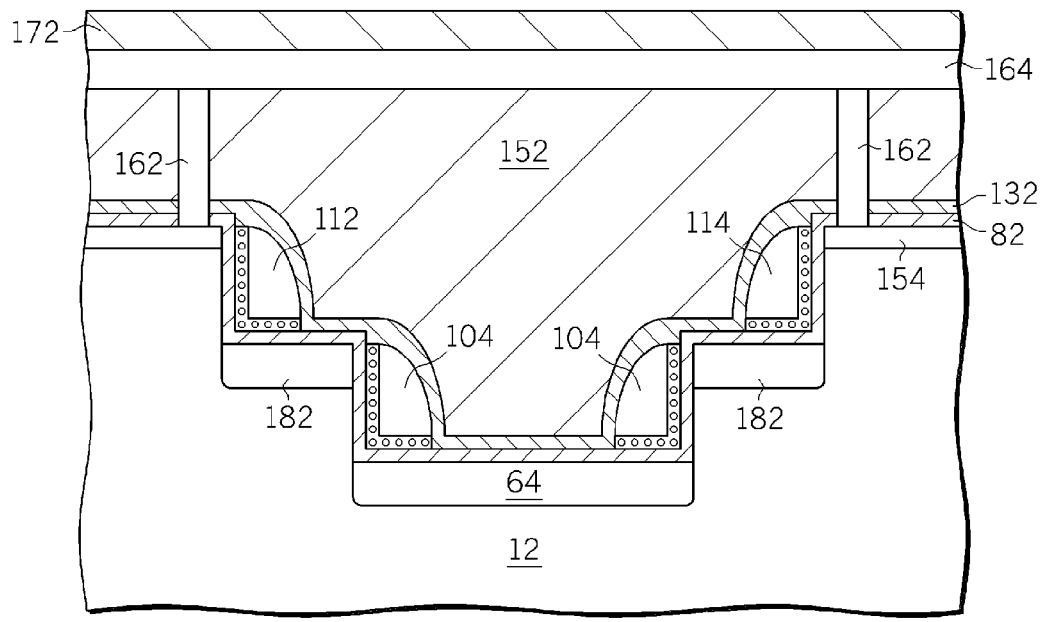
FIG. 19 includes an illustration of a cross-sectional view of a workpiece of FIG. 18 after an electronic device is substantially completed.

In another embodiment, another NVM array 18 layout and interconnect scheme may be used. The electronic device is formed by an embodiment and using materials as previously described for FIGS. 1 through 5. In an embodiment, doped region 182 can be formed under ledge 52, as illustrated in FIG. 18. More specifically, sidewall spacers 42 can then be removed, exposing substantially all the interior surface of trench 22, including ledge 52, prior to formation of doped regions 64. Insulating layer 62 is formed as previously described and can cover the additional exposed portions of trench 22. In one embodiment, doped regions 182 within ledges 52 are formed in addition to doped regions 64. The dopant can include one or more materials or be formed using any of the embodiments previously described with respect to doped region 64. The dopant can be the same or different composition than the one used to form doped region 64 and may be formed by the same or different formation technique compared to doped region 64. In one particular embodiment, doped regions 64 and 182 are formed concurrently. In an alternative embodiment, doped region 64 can be formed prior to removal of sidewall spacer 42. An insulating layer can then formed overlying ledge 52. Doped region 182 are formed as previously described. In one embodiment, doped region 64 and doped region 182 may contain different dopants or different dopant concentrations. Formation of the workpiece proceeds by an embodiment previously described with respect to FIGS. 7 through 17, forming the substantially completed electronic device, as illustrated in FIG. 19.

Figure 20:
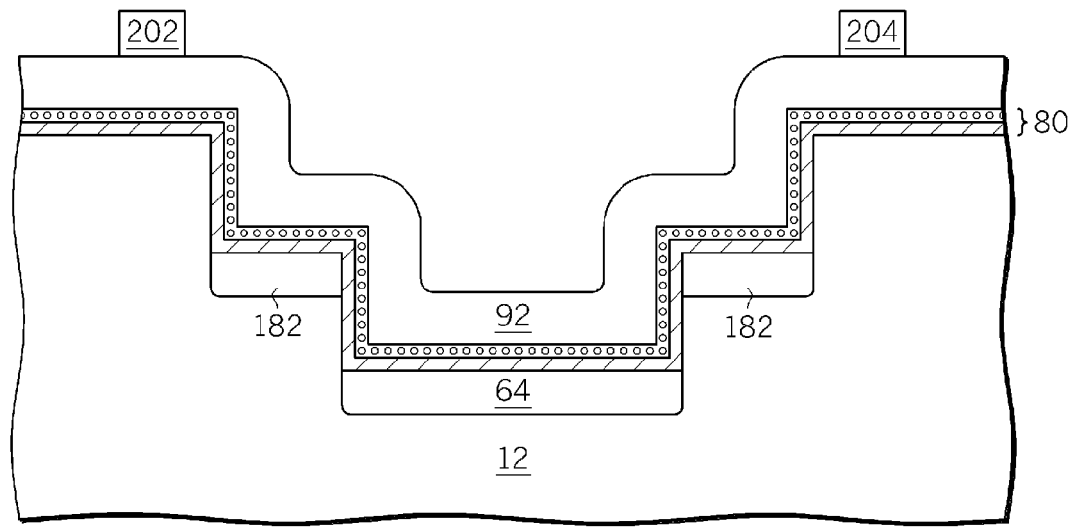
FIG. 20 includes an illustration of a cross-sectional view of a workpiece of FIG. 9, formed in accordance with an alternative embodiment, after formation of resist features.

In another embodiment, yet another NVM array 18 layout and interconnect scheme may be used. Gate electrodes can be formed outside and adjacent to the trench 22. A workpiece is formed by one or more embodiments previously described with respect to FIGS. 1 through 9 and 18. Doped region 182 may (FIG. 18) or may not (FIG. 6) be formed. Resist members 202 and 204 can be formed by a conventional, lithographic technique, overlying conductive layer 92 and primary surface 13 as illustrated in FIG. 20. Resist members 202 and 204 can be adjacent to and substantially parallel to the length of trench 22.

Figure 21:
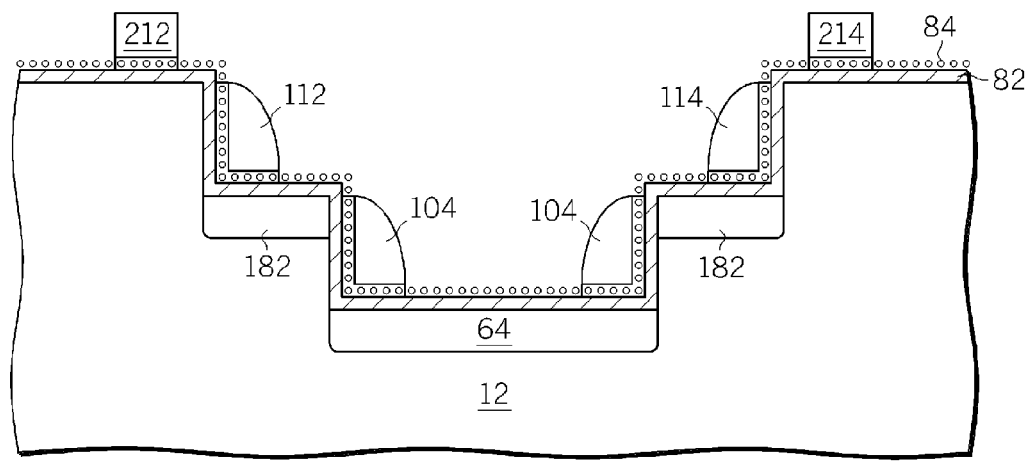
FIG. 21 includes an illustration of a cross-sectional view of a workpiece of FIG. 20 after formation of gate electrodes.

Material from conducting layer 92 is then removed anisotropically as previously described to form structure 102 and gate electrode 104 within trench 22 and conductive lines 212 and 214 overlying primary surface 13. Structure 102 can be further processed to form gate electrodes 112 and 114, as previously described. FIG. 21 includes an illustration at this point of the process. In one embodiment, portions of conductive lines 212 and 214 can serve as gate electrodes in a finished device. The remaining portions of resist, including resist members 202 and 204 are removed from the workpiece.

Figure 22:
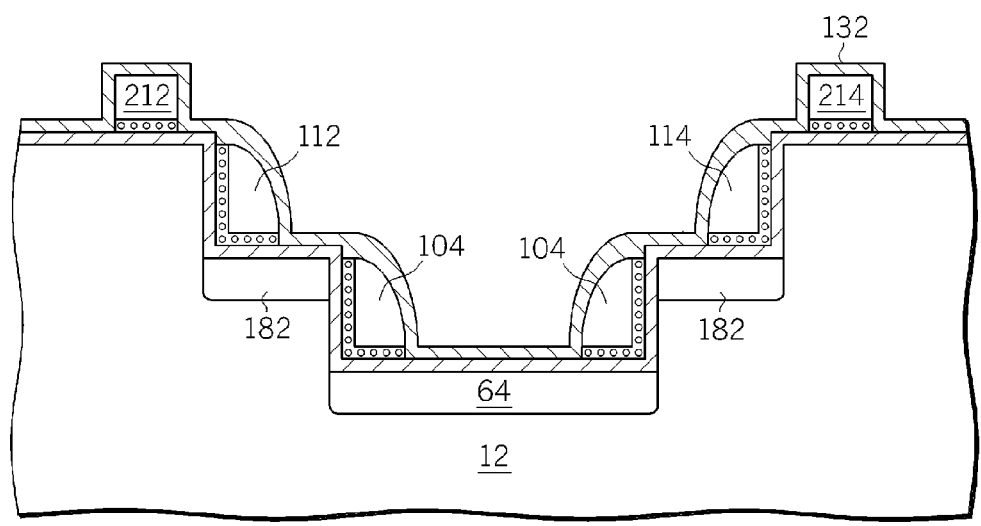
FIG. 22 includes an illustration of a cross-sectional view of the workpiece of FIG. 21 after formation of an insulating layer.
Figure 23:
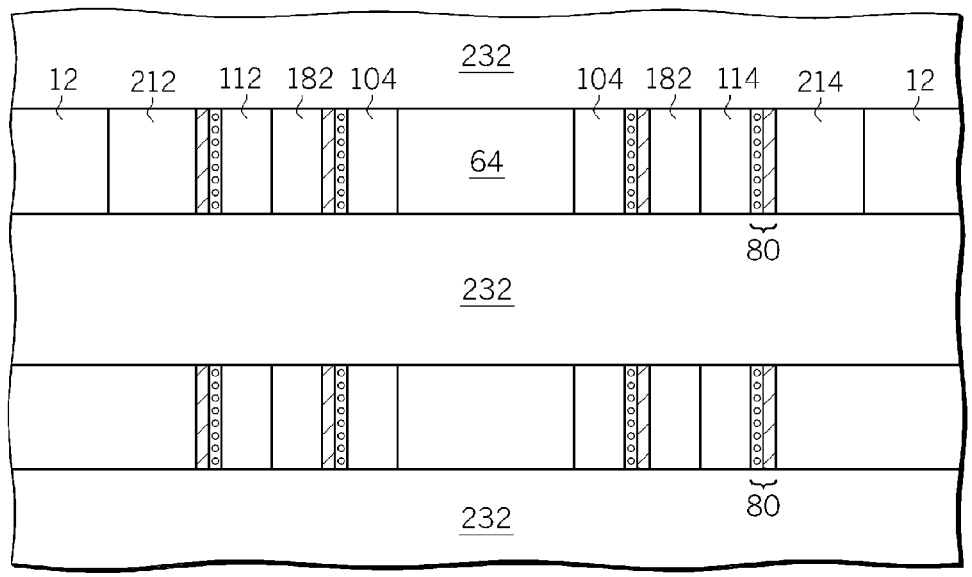
FIG. 23 includes an illustration of a top view of the workpiece of FIG. 22 after formation of a patterned resist layer.

Exposed portions of dielectric layer 86 are removed as described previously. Insulating layer 132 can be formed as previously described, as illustrated in FIG. 22. Resist layer 232 is formed with openings overlying portions of substrate 12 and trench 22, that will underlie subsequently formed bit lines, as illustrated in FIG. 23.

Figure 24:
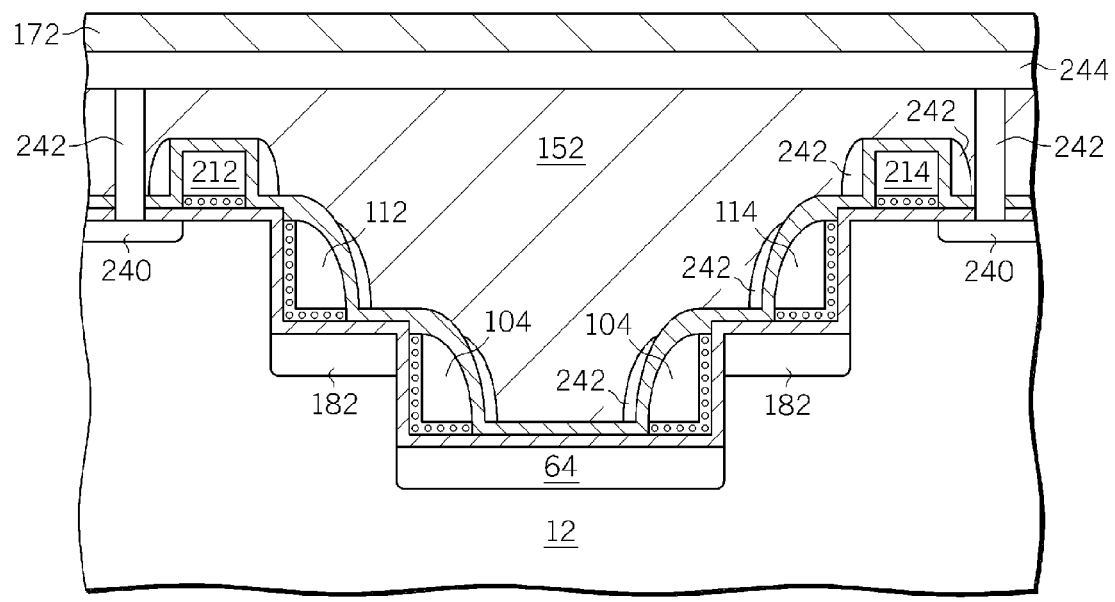
FIGS. 24 and 25 include illustrations of a cross-sectional view and a top view, respectively, of the workpiece of FIGS. 22 and 23 after an electronic device is substantially completed.
Figure 25:
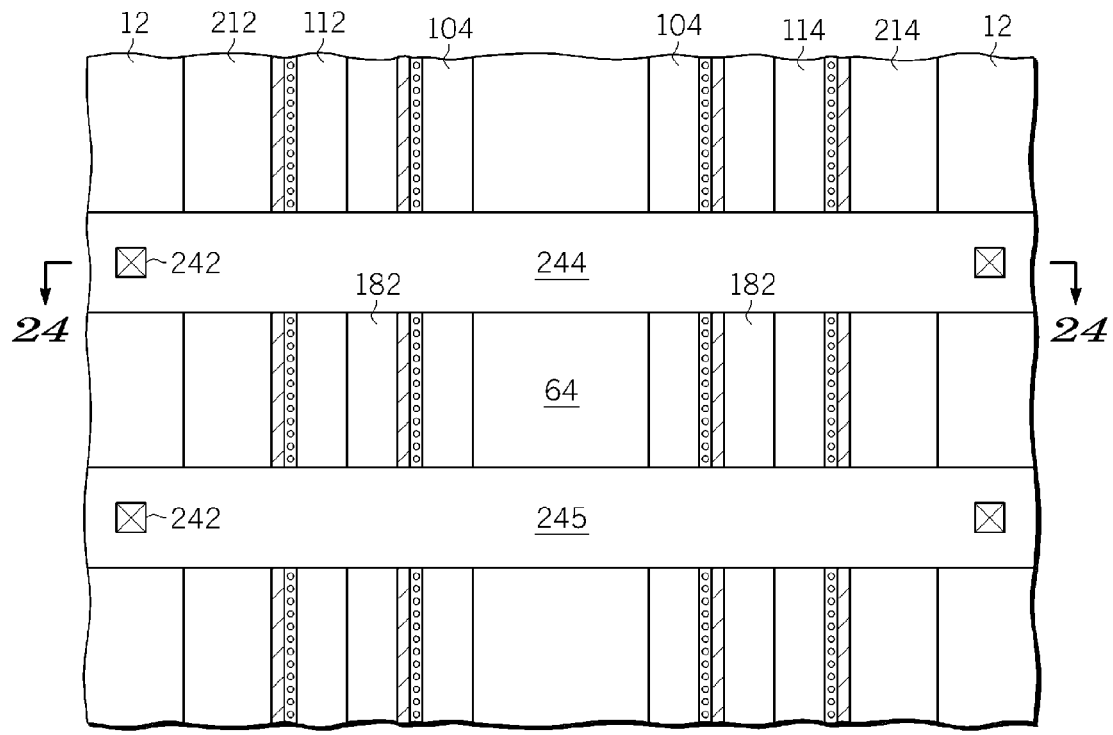

A dopant is introduced to substrate 12 to form doped region 240, as illustrated in FIG. 24. The dopant can include one or more materials or be formed using any of the embodiments previously described with respect to doped region 64. The dopant can be the same or different composition than the one used to form doped region 64 and may be formed by the same or different formation technique compared to doped region 64. Optional sidewall spacers 242 can be formed. Processing of memory cells in NVM array 18, other than electrical connections, can be completed as previously described for FIGS. 15 and 16, illustrated in FIGS. 24 and 25, respectively. Conductive plugs 242 and conductive lines 244 and 245 are formed using any embodiment previously described for conductive plugs 162 and conductive lines 164 and 165. The locations and orientation of conductive lines 244 and 245 are substantially the same as conductive lines 164 and 165. The locations of conductive plugs 242 are different from those illustrated for conductive plugs 162. Conductive plugs 242 overlie doped region 240. In one embodiment doped region 240 can serve as a S/D region in a finished device. In a further embodiment, an electronic device can include memory cells as illustrated in FIG. 24 except that doped regions 182 are not present.

Figure 26:
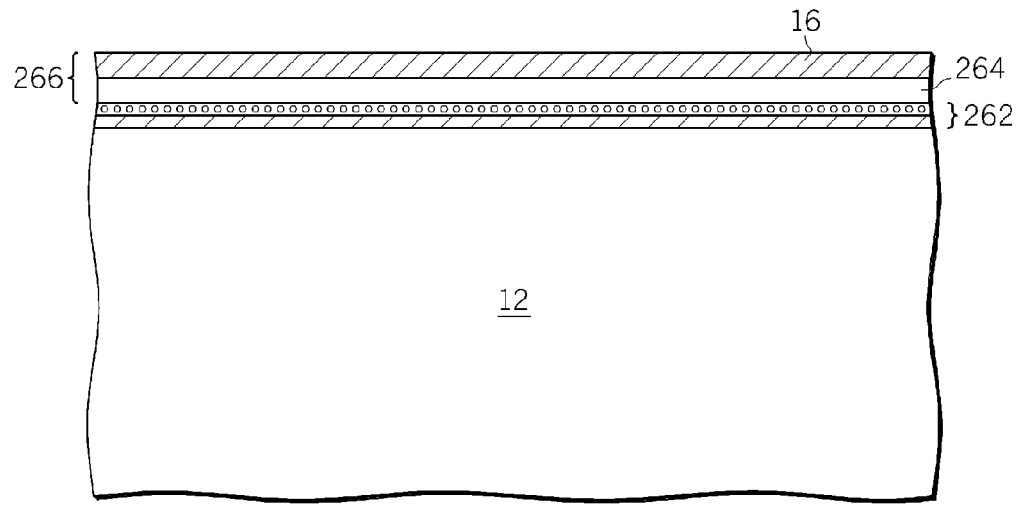
FIG. 26 includes an illustration of a cross-sectional view of an alternative embodiment wherein a protective layer includes a charge storage stack, an intervening layer, and oxidation-resistant layer in accordance with an embodiment.

In another embodiment, a different NVM array 18 layout and interconnect scheme may be used. In this embodiment, a charge storage stack 262 is formed overlying substrate 12 as illustrated in FIG. 26. Charge storage stack 262 can be formed using one more embodiments and can include one or more materials previously described for formation of charge storage stack 80. In one embodiment, charge storage stack 262 is formed immediately adjacent to primary surface 13. Intervening layer 264 can be formed overlying charge storage stack 80. Intervening layer 264 can function as a pad layer during processing. In one embodiment, in a finished electronic device, remaining portions of intervening layer 264 can be conductive and can set the work function for memory cell structures that will be formed in NVM array 18 outside the trenches. In another embodiment, intervening layer 264 can be polysilicon, doped polysilicon or a metal-containing material. In yet another embodiment, intervening layer 264 can be less than approximately 200 nm in thickness. Oxidation-resistant layer 16 can be formed using one or more of the previously described embodiments. Protective layer 266 includes intervening layer 264 and oxidation-resistant layer 16. Trench 22 is formed as previously described. In one embodiment, an operation can be added to the etch process to help remove exposed portions of charge storage stack 262 during formation of trench 22. In another embodiment, one or more of the etch processes used to form trench 22 can be extended sufficiently to remove charge storage stack 262 and make trench 22 the desired depth.

Figure 27:
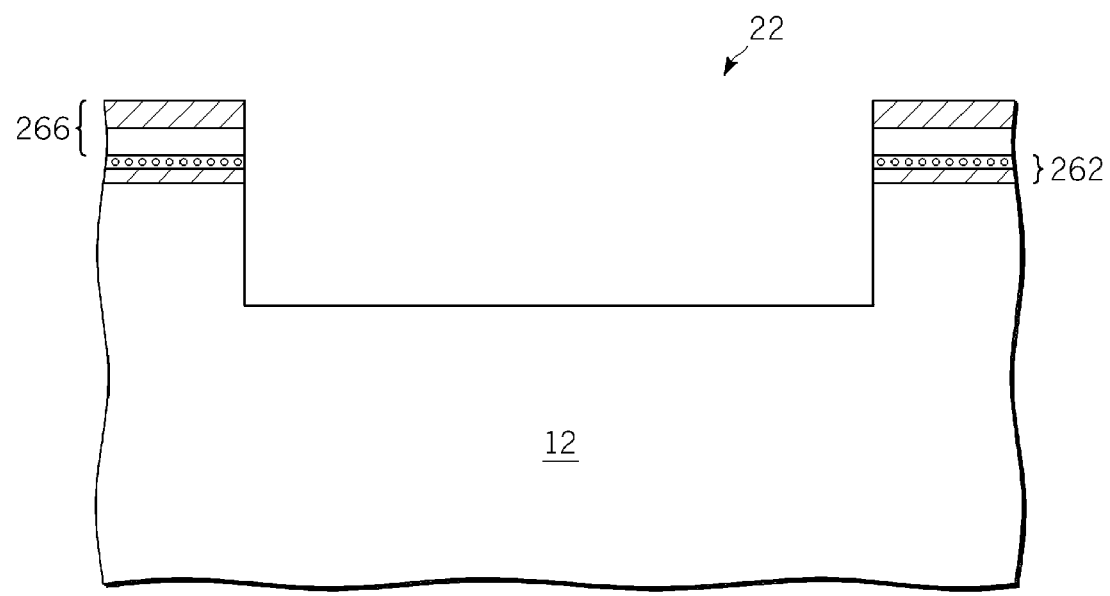
FIG. 27 includes an illustration of a cross-sectional view of the workpiece of FIG. 26 after formation of a portion of a trench.
Figure 28:
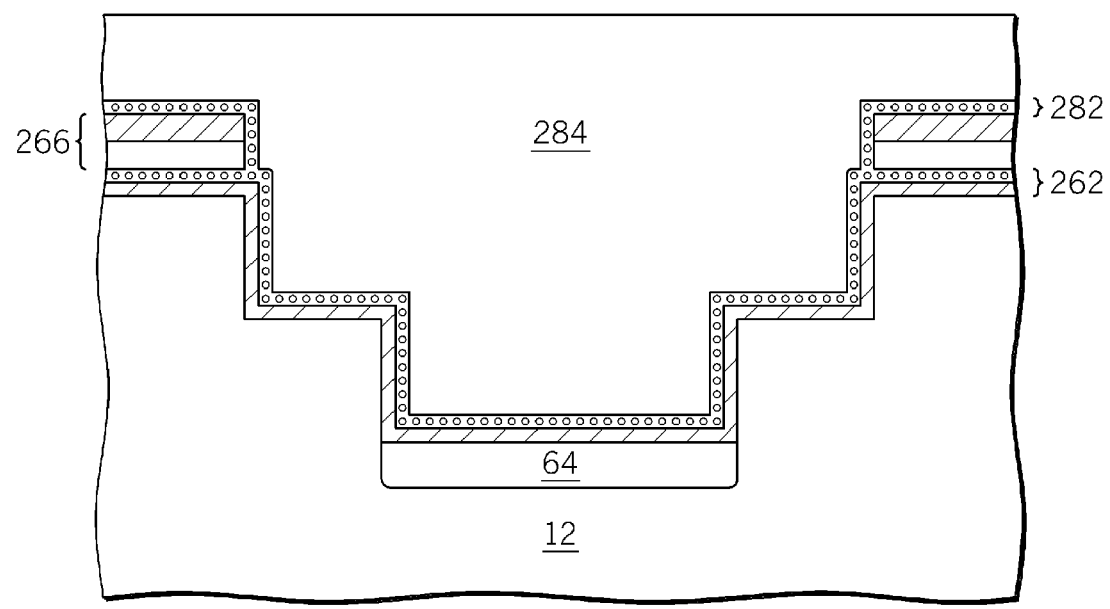
FIG. 28 includes an illustration of a cross-sectional view of the workpiece of FIG. 27 after additional processing and formation of a sacrificial layer.

In one embodiment, processing proceeds as previously described for FIGS. 3 through 5. In one embodiment, illustrated in FIG. 27, doped region 182 is not formed. In another embodiment (not illustrated), doped region 182 is formed as previously described. In one embodiment, a charge storage stack 282 is formed by one or more embodiments previously described for formation of charge storage stack 80 as illustrated in FIG. 28. Charge storage stack 282 can comprise the same or different materials or be formed by the same or different technique as those used to form charge storage stack 80. A sacrificial layer 284 can be formed overlying the workpiece. In one embodiment sacrificial layer 284 can be a resist layer. Portions of sacrificial layer 284 are removed to expose portions of charge storage stack 282 overlying primary surface 13 within the NVM array 18. Exposed portions of charge storage stack 282 are removed by one or more embodiments previously described for removal of charge storage stack 80. Remaining portions of oxidation-resistant layer 16 within the NVM array 18 are then removed, as illustrated in FIG. 29. The remainder of sacrificial layer 284 is removed from trench 22 and elsewhere.

In one embodiment, conductive layer 92 is formed as previously described in this specification. Processing then proceeds to substantial completion of the device as described in FIGS. 20 through 25. Doped regions 182 may or may not be present. Conductive lines 212 and 214 are formed as previously described. In one embodiment, portions of intervening layer 264 are included as part of the conductive lines 212 and 214. If used as a gate electrode, conductive lines 212 and 214 can have different work functions than other gate electrodes that do not include portions of intervening layer 264.

After reading this specification, skilled artisans will appreciate that many variations regarding doping portions of the substrate 12 can be used. Doped regions that are at least part of source/drain regions for the memory cells within NVM array 18 have an opposite conductivity type as compared to substrate 12. The portion of substrate 12 as illustrated in the figures may or may not lie within one or more well regions. Such well region(s) may be different from one or more other well regions within peripheral areas (outside NVM array 18). Other doping can be performed that may affect breakdown voltages, resistivity, threshold voltage, hot carrier generation, one or more other electrical characteristics, or any combination thereof. Skilled artisans will be able to form electronic devices having doping characteristics that meet their needs or desires.

NVM array 18 can include memory cells using any of the layouts as previously described. Circuit schematics and cross references to physical embodiments are described to illustrate better how memory cells within NVM array 18 can be electrically configured and programmed.

Figures 31, 32:
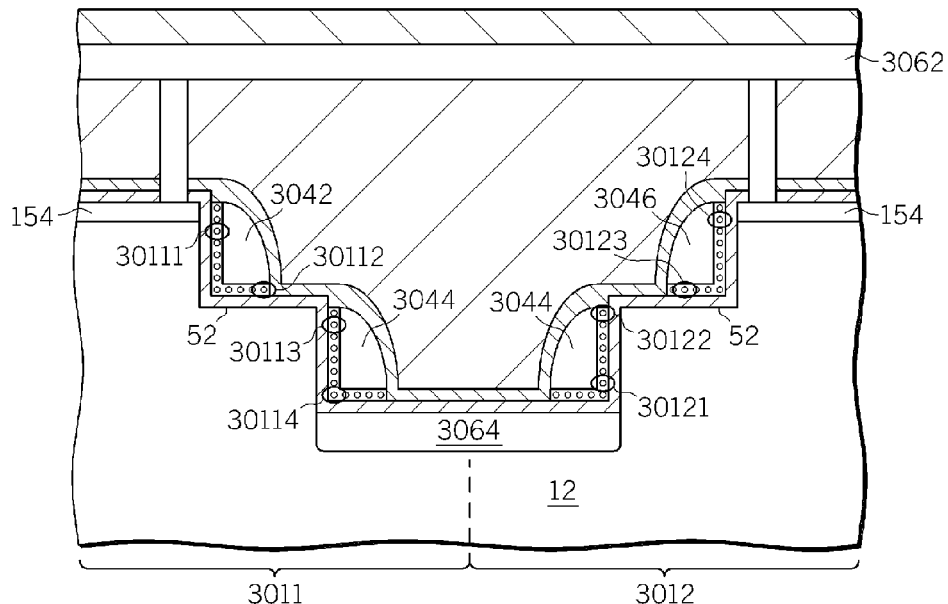

FIG. 30 includes a circuit schematic for an embodiment as described with respect to the embodiment as illustrated in FIG. 31. Memory cells 3011, 3012, 3021, and 3022 are oriented within NVM array 18, as illustrated in FIG. 30. In the figures, "BL" refers to a bit line, "GL" refers to a gate line, "CG" refers to a control gate line, and "SG" refers to a select gate line. Depending on biasing conditions, GL can be a CG or an SG.

Referring to FIG. 30, BL1 3062 is electrically connected to a S/D region of memory cell 3011 and a S/D region of memory cell 3012. BL2 3064 is electrically connected to the other S/D regions of memory cells 3011 and 3012 and to a S/D region of memory cell 3021 and a S/D region of memory cell 3022. BL3 3066 is electrically connected to the other S/D regions of memory cells 3021 and 3022. GL1 3042 is electrically connected to a gate electrode of memory cell 3011 and a gate electrode of memory cell 3021. GL2 3044 is electrically connected to the other gate electrodes of memory cells 3011 and 3021, and to gate electrodes of memory cells 3012, and 3022. GL3 3046 is electrically connected to the other gate electrode of memory cell 3012 and the other gate electrode of memory cell 3022.

Bit line control module 3092 is coupled to BL1 3062, BL2 3064, and BL3 3066, and gate line control module 3094 is coupled to GL1 3042, GL2 3044, and GL3 3046. Each of bit line control module 3092 and gate line control module 3094 are conventional and may include row or column decoders, voltage drivers, other suitable circuits to operate NVM array 18, or any combination thereof. Each of bit line control module 3092 and gate line control module 3094 can include more than one control module. Each of bit line control module 3092 and gate line control module 3094 can the bit lines to be biased or electrically float to achieve the proper operation of NVM array 18.

FIG. 31 illustrates a physical embodiment of a portion of NVM array 18 corresponding to the row that includes memory cells 3011 and 3012. FIG. 31 is substantially the same as FIG. 17 except that reference numbers as used in the circuit schematics are used in FIG. 31.

Charge storage regions for memory cells 3011 and 3012 are illustrated in FIGS. 30 and 31. Memory cell 3011 includes charge storage regions 30111 to 30114, and memory cell 3012 includes charge storage region 30121 to 30124. Memory cells 3021 and 3022 include similar charge storage regions, but such charge storage regions are not specifically identified in FIG. 30. The significance of the charge storage regions will become apparent to skilled artisans after a reading corresponding regarding the operation of the electronic device, as described below.

FIG. 32 includes a table that has some of the operating voltages for memory cells 3011 and 3012, as illustrated in FIG. 30. After reading this specification and the figures, skilled artisans will be able to determine appropriate operating voltages for memory cells 3021 and 3022. Charge storage regions 30111 and 30114 lie closer to bit lines 3062 and 3064, respectively, and are programmed by HCI. Charge storage regions 30112 and 30113 lie further from bit lines 3062 and 3064 compared to the charge storage regions 30111 and 30114 and are programmed using source-side injection. While many voltages are given in the table in FIG. 32 and other tables within this specification, other voltages may be used. The relative values between the voltages, rather than their absolute values are more relevant, as the absolute values of voltages can change with changes in physical parameters.

Regarding FIGS. 30 and 31, an exemplary embodiment used to program charge storage region 30111 is described. The voltages on GL1 3042 and GL2 3044 are substantially the same and sufficient to allow current to flow through the channel region regardless of the programming state of memory cell 3011. As electrons flow from BL2 3064 towards BL1 3062, hot carriers are generated and are injected into discontinuous storage elements 84 close to GL1 3042 and its adjacent doped region 154. In another embodiment, where charge storage region 30112 is programmed, the voltage on BL1 3062 can be slightly lower than when programming charge storage region 30111, but is sufficiently high enough to allow current to flow between the BL2 3064 and BL1 3062. The voltage on GL1 3042 is higher than the voltage on GL2 3044. The relative voltages between GL1 3042 and GL2 3044 allow a significant electrical field to be generated within substrate 12 adjacent to ledge 52 between GL1 3042 and GL2 3044, such an electrical field allows hot carriers to be generated, and the voltage on GL1 3042 allows at least some of the hot carriers to be injected into discontinuous storage elements 84 near the ledge 52. The other memory cells 3012, 3021, and 3022 are not programmed because the voltage on GL3 3046 is zero and because BL3 3066 and BL4 3068 are at substantially the same voltage so that no current flows between those bit lines.

On a relative basis and when the substrate 12 (or associated well region therein) is biased to zero volts, when programming charge storage region 30112, each of the voltages on GL1 3042 and GL2 3044 is approximately between one and two times higher than the voltage on BL1 3062. In one particular embodiment, the voltage on GL1 3042 is higher than the voltage on GL2 3044. The combination of voltages on BL1 3062 and GL1 3042 allows a sufficient electric field to be formed near doped region 152 to help generate a sufficient number of hot carriers that can be injected into the discontinuous storage elements at charge storage region 30112.

The programming of charge storage regions 30113 and 30114 are substantially similar except that the voltages on GL1 3042 and GL2 3044 and on BL1 3062 and BL2 3064 are reversed as compared to charge storage regions 30112 and 30111, respectively. Other memory cells are programmed in a similar manner. Within each memory cell in FIG. 30, charge storage regions closer to the bit lines are programmed using HCI, and charge storage regions further from the bit lines are programmed using SSI. Each memory cell can hold up to four bits of data.

Flash erasing of NVM array 18 can be accomplished by creating a potential difference in a range of about 12 to 16 volts between substrate 12 (or well region therein) and the gate electrodes of the memory cells. In one embodiment, erasing can be performed by biasing substrate 12 (or associated well region therein) to approximately −7 volts, setting the gate lines to approximately +7 volts, and allowing the bit lines to electrically float. In another embodiment, erasing can be performed by placing substrate 12 (or well region therein)

to approximately −7 volts, placing the gate lines to +7 volts and allowing the bit lines to electrically float. Note that the voltages used for substrate 12 and the gate line do not need to be symmetric with respect to 0 volts. For example, a combination of +5 volts and −9 volts can be used. After reading this specification, skilled artisans will be able to determine a set of voltages to be used for erasing that meets their needs or desires. Any charge that may have accumulated within the discontinuous storage elements 84 may be removed by Fowler-Nordheim tunneling.

The reading of data within NVM array 18 for memory cells 3011 to 3012 is given in FIG. 32. When reading datum at charge storage region 30111, BL1 3062 and BL2 3064 are biased so that electrons flow from BL1 3062 to BL2 3064. GL2 3044 is biased so that the channel region lying adjacent to GL2 3044 allows carriers to flow regardless of the programming state at charge storage regions 30113 and 30114. In addition, GL2 3044 is biased sufficiently high that fringing fields will shield charges stored at charge storage region 30112, thus allowing only 30111 to be sensed. GL1 3042 is biased to a voltage between the programmed and erased threshold voltages. In one particular embodiment, GL1 3042 has a voltage that is approximately 0.35 to 0.65 times the voltage difference between BL2 3064 and GL2 3044. A sense amplifier (not illustrated) coupled to the BL1 3062 or BL2 3064 may detect a higher level of current when the charge storage region 30111 is not programmed compared to when the charge storage region 30111 is programmed. As compared to reading datum at charge storage region 30111, when reading datum at charge storage region 30112, the voltages on BL1 3062 and BL2 3064 are reversed, such that electrons flow from BL2 3064 to BL1 3062. The voltage at BL1 3062 is high enough to deplete into the channel region of memory cell 3011 and shield charge stored at charge storage region 30111. GL2 3044 is biased just high enough to allow carriers to flow regardless of the programmed state at charge storage regions 30113 and 30114, but not so high that fringing fields shield the charge that is to be read at 30112. The reading of data at other charge storage regions with memory cells 3011, 3012, 3021, and 3022 can be performed in a similar manner.

Figure 33:
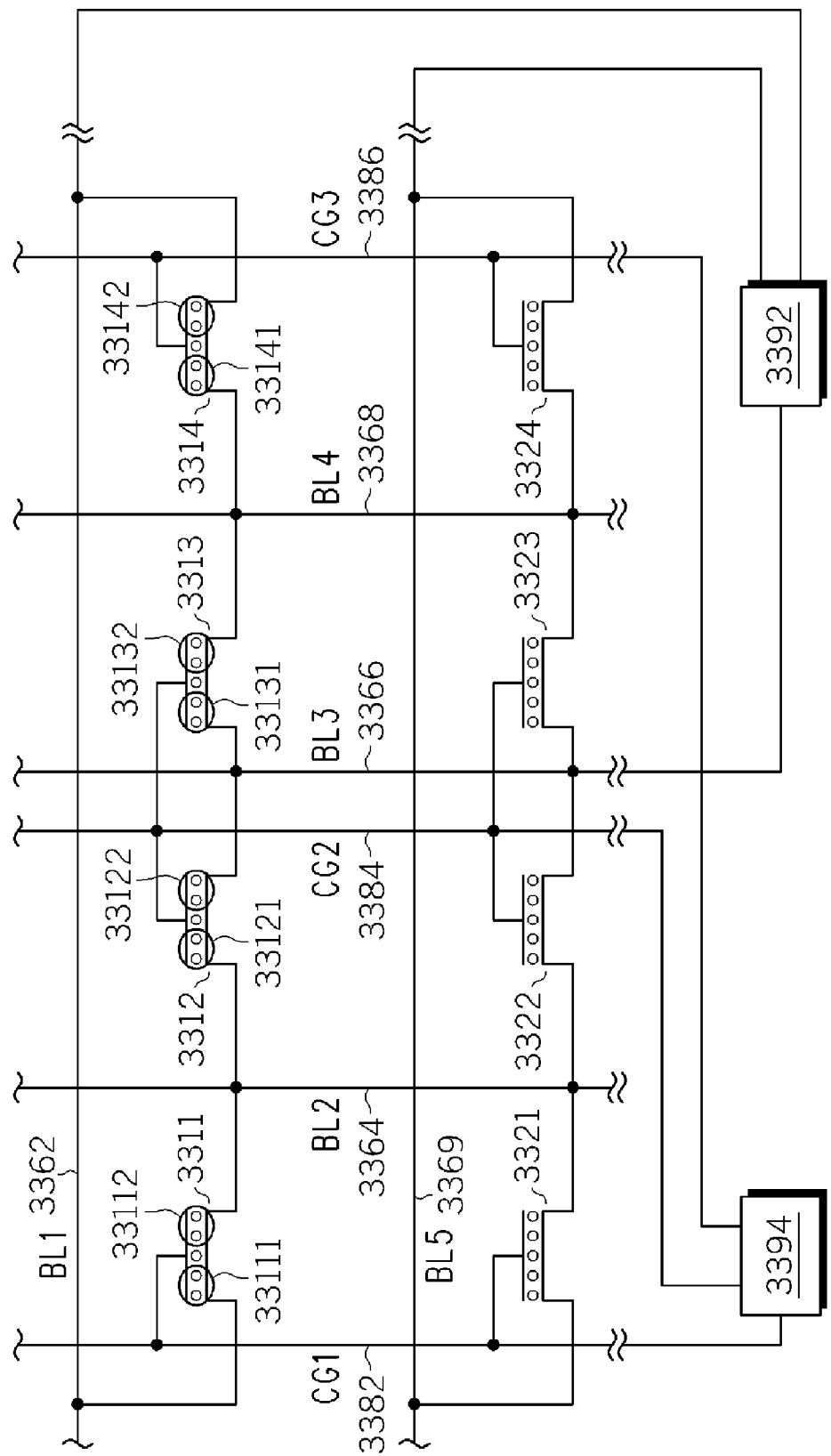
Figure 34:
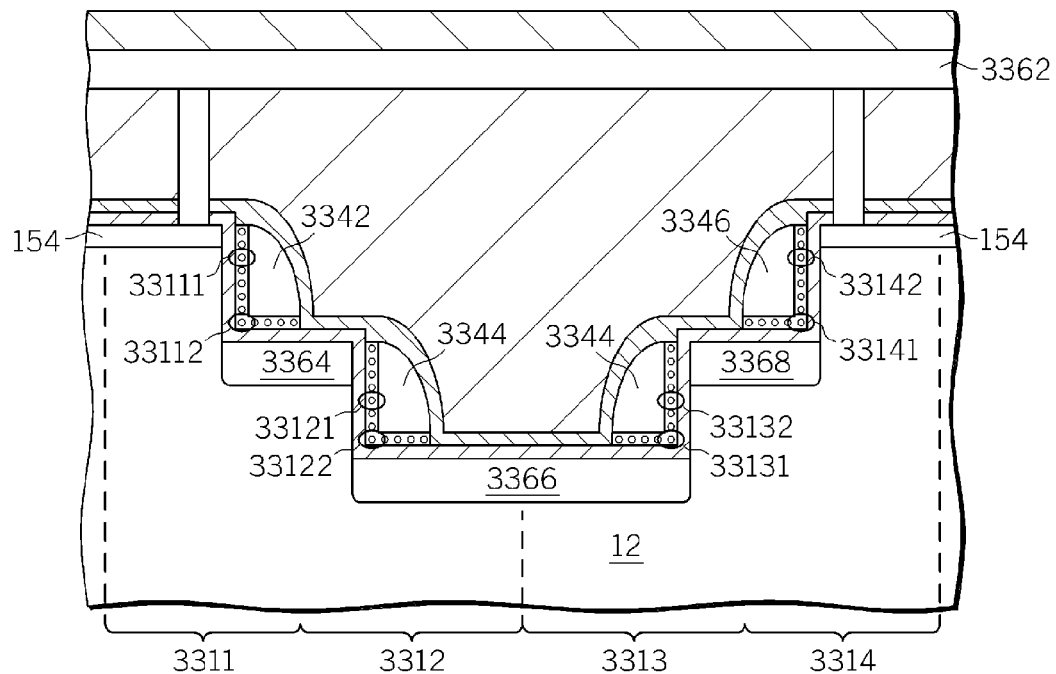

FIG. 33 includes a circuit schematic for an embodiment as described with respect to the embodiment as illustrated in FIG. 34. Memory cells 3311, 3312, 3313, 3314, 3321, 3322, 3323, and 3324 are oriented within NVM array 18, as illustrated in FIG. 33.

Referring to FIG. 33, BL1 3362 is electrically connected to a S/D region of memory cell 3311 and a S/D region of memory cell 3314. BL2 3364 is electrically connected to the other S/D region of memory cell 3311 and S/D regions of memory cells 3312, 3321, and 3322. BL3 3366 is electrically connected to the other S/D regions of memory cells 3312 and 3322 and S/D regions of memory cells 3313 and 3323. BL4 3368 is electrically connected to the other S/D regions of memory cells 3313, 3314, 3323 and a S/D region of memory cell 3324. BL5 3369 is electrically connected to the other S/D regions of memory cells 3321 and 3324. In one particular embodiment, BL2 3364 and BL4 3368 are allowed to electrically float, are electrically connected to each other, or both.

Bit line control module 3392 is coupled to BL1 3362, BL3 3366, and BL5 3369, and gate line control module 3394 is coupled to CG1 3382, CG2 3384, and CG3 3386. Each of bit line control module 3392 and gate line control module 3394 are conventional and may include row or column decoders, voltage drivers, other suitable circuits to operate NVM array 18, or any combination thereof. Each of bit line control module 3392 and gate line control module 3394 can include more than one control module. Each of bit line control module 3392 and gate line control module 3394 can the bit lines to be biased or electrically float to achieve the proper operation of NVM array 18. In one embodiment, BL2 3364 and BL4 3368 are only electrically connected to source/drain regions along a column of memory cells and are not connected to any circuit outside NVM array 18, such as bit line control module 3392. In another embodiment (not illustrated), BL2 3364 and BL4 3368 are electrically connected to bit line control module 3392, and bit line control module 3392 can allow BL2 3364, BL4 3368, other bit line (not illustrated), or any combination thereof to electrically float at proper times when operating NVM array 18.

CG1 3382 is electrically connected to control gate electrodes of memory cells 3311 and 3321. CG2 3384 is electrically connected to control gate electrodes of memory cells 3312, 3313, 3322, and 3323. CG3 3386 is electrically connected to control gate electrodes of memory cells 3314 and 3324.

FIG. 34 illustrates a physical embodiment of a portion of NVM array 18 corresponding to the row that includes memory cells 3311, 3312, 3313, and 3314. FIG. 34 is substantially the same as FIG. 19 except that reference numbers as used in the circuit schematics are used in FIG. 34.

Charge storage regions for memory cells 3311 through 3314 are illustrated in FIGS. 33 and 34. Memory cell 3311 includes charge storage regions 33111 and 33112, memory cell 3312 includes charge storage regions 33121 and 3312, memory cell 3313 includes charge storage regions 33131 and 33132, and memory cell 3314 includes charge storage regions 33141 and 33142. The memory cells 3321 to 3324 include similar charge storage regions but are not illustrated in FIG. 33.

FIG. 35 includes a table that has some of the operating voltages for memory cells along the top row of memory cells, as illustrated in FIG. 33. When programming charge storage region 33111, BL1 3362 and BL3 3366 are biased to allow electrons to flow from BL3 3366 to BL1 3362. CG2 3384 is over-driven such that BL2 3364, when electrically floating, is pulled to a voltage close to that of BL3 3366. Electrons are allowed to flow through the channel region of memory cell 3312 regardless of the programming state of memory cell 3312. Referring to FIG. 34, the channel region of memory cell 3312 is adjacent to CG2 3384 and between BL2 3364 and BL3 3366. BL2 3364 can act as an electrical short to allow electrons to continue flowing to the channel region of memory cell 3311. The channel region of memory cell 3311 is adjacent to CG1 3382 and between BL1 3362 and BL2 3364. CG1 3382 is biased to allow electrons to flow to the doped region 154. The electrical field generated in the channel region of memory cell 3311 near the doped region 154 (via BL1 3362) and CG1 3382 is sufficient to generate hot carriers within the channel region of memory cell 3311 near doped region 154. At least some of the hot carriers are attracted to the discontinuous storage elements at charge storage region 33111. The programming mechanism for all charge storage regions in the NVM array in FIG. 33 is HCI. Thus, carriers flow from BL3 3366 to BL1 3362 via source/drain regions of memory cells 3311 and 3312, which can be electrically connected to BL2 3364. In another embodiment (not illustrated), the source/drain regions of memory cells 3311 and 3312 can be electrically connected to each other and are not electrically connected to a bit line.

The other memory cells 3312, 3321, and 3322 are not programmed because the voltage on CG3 3386 is zero and because BL3 and BL5 3369 are at substantially the same voltage so that no current flows between those bit lines. On a relative basis and when the substrate 12 (or associated well region therein) is biased to zero volts, when programming charge storage region 33111, the voltages on CG1 3382 and CG2 3384 are in a range of approximately one to two times higher than the voltage on BL1 3362. In one particular embodiment, the voltages on CG1 3382 and BL1 3362 are approximately the same, and BL2 3364 is allowed to electrically float.

Charge storage region 33112 can be programmed in a similar manner to programming charge storage region 33111 except that the biasing of BL1 3362 and BL3 3366 are reversed. In this embodiment, BL2 3364 is pulled to a voltage close to BL3 3366 and a lateral field develops along the channel region of memory cell 3311 that facilitates HCI programming at charge storage region 33112 closest to BL2 3364. Other charge storage regions and other memory cells are programmed in similar manners. All programming is performed using HCI. Each memory cell in FIG. 33 can store up to two bits of data.

Similar to the embodiments described with respect to FIGS. 30 to 32, erasing of NVM array 18 can be accomplished by creating a potential difference in a range of about 12 to 16 volts between substrate 12 (or well region therein) and the gate electrodes of the memory cells. In one embodiment, erasing can be performed by biasing substrate 12 (or associated well region therein) to approximately −7 volts, setting the control gate lines to approximately +7 volts, and allowing the bit lines to electrically float. In another embodiment, erasing can be performed by placing substrate 12 (or well region therein) to approximately −7 volts, placing the gate lines to +7 volts and allowing the bit lines to electrically float. Note that the voltages used for substrate 12 and the gate line do not need to be symmetric with respect to 0 volts. For example, a combination of +5 volts and −9 volts can be used. After reading this specification, skilled artisans will be able to determine a set of voltages to be used for erasing that meets their needs or desires The reading of data within NVM array 18 for memory cells 3311 to 3314 is given in FIG. 35. When reading datum at charge storage region 33111 of memory cell 3311, BL1 3362 and BL3 3366 are biased so that electrons flow from BL1 3362 to BL3 3366. CG2 3384 is biased so that BL2 3364 is pulled to a voltage close to BL3 3366, which is sufficiently high to shield charge in charge storage region 33112. The channel region lying adjacent to CG2 3384 allows carriers to flow regardless of the programming state at charge storage regions 33121 and 33122. CG1 3382 is biased to a read voltage between the programmed and erased levels. In one particular embodiment, CG1 3382 has a voltage that is approximately 0.35 to 0.65 times the voltage difference between BL1 3362 and CG2 3384. A sense amplifier (not illustrated) coupled to the BL1 3362 or BL3 3366 will detect a higher level of current when the charge storage region 33111 is not programmed compared to when the charge storage region 33111 is programmed. As compared to reading datum at charge storage region 33111, when reading datum at charge storage region 33112, the voltages on BL1 3362 and BL3 3366 are reversed, causing the bias at BL1 3362 to shield charge at charge storage region 33111. All other voltages can be kept substantially the same. The reading of data at other charge storage regions with memory cells 3311 to 3314 and 3321 to 3324 can be performed in a similar manner.

Figure 36:
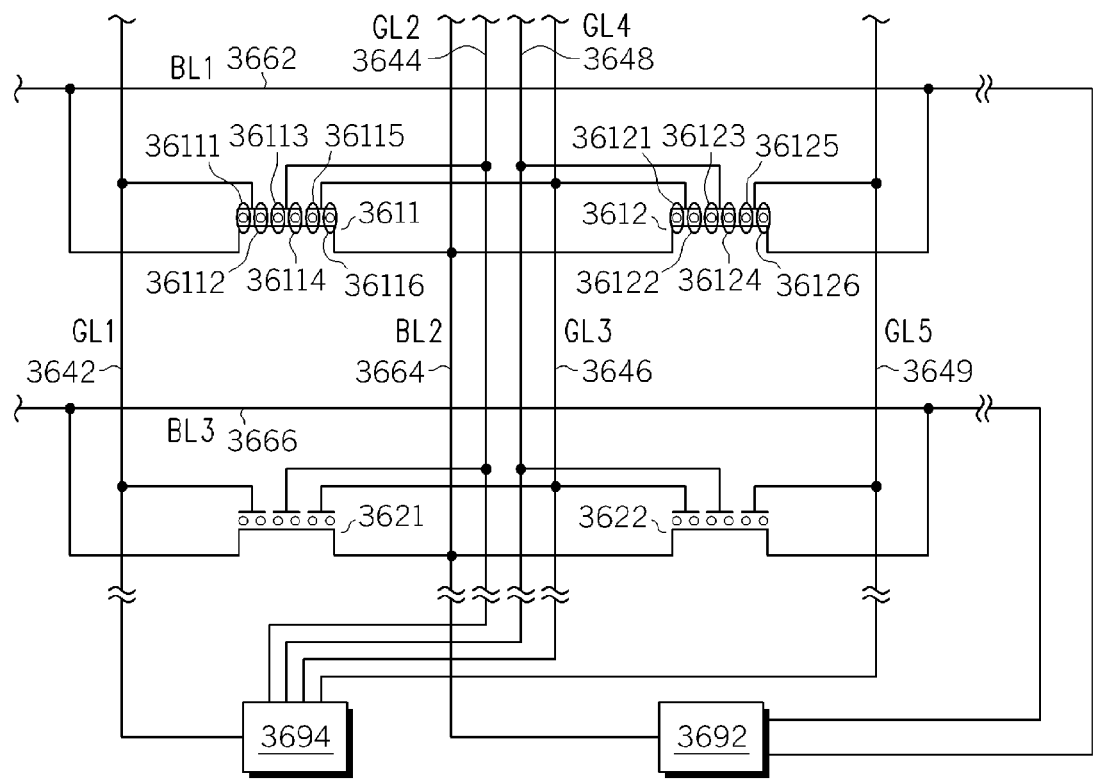
Figure 37:
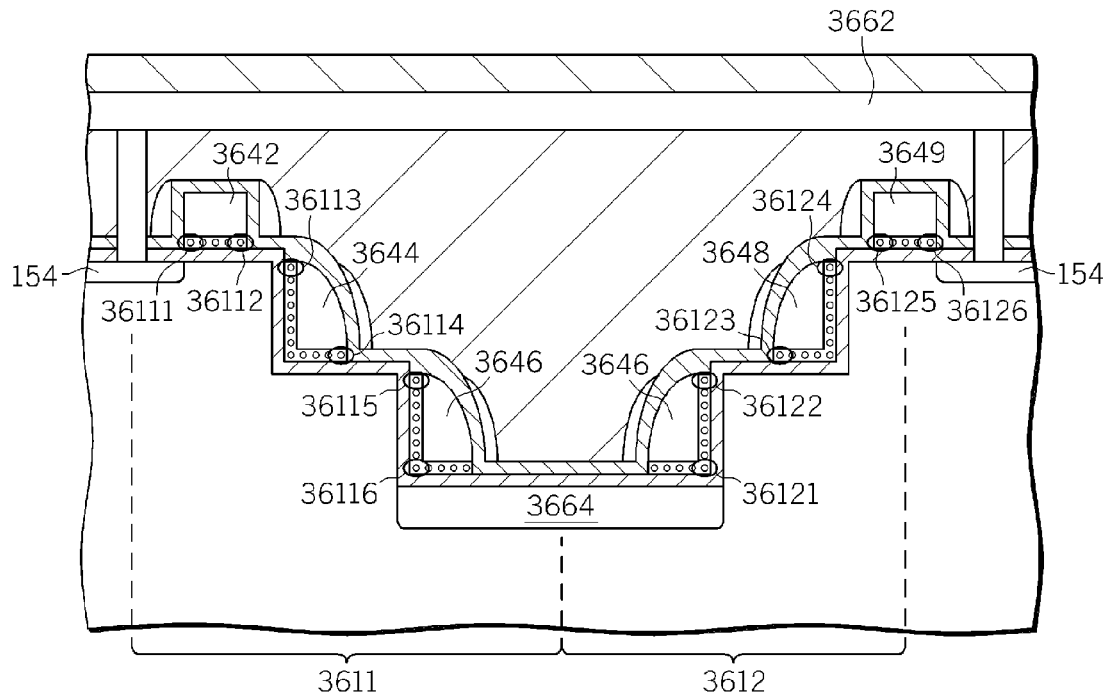

FIG. 36 includes a circuit schematic for an embodiment as described with respect to the embodiment as illustrated in FIG. 37, except formed without doped regions 182. Memory cells 3611, 3612, 3621, and 3622 are oriented within NVM array 18, as illustrated in FIG. 36.

Referring to FIG. 36, BL1 3662 is electrically connected to a S/D region of memory cell 3611 and a S/D region of memory cell 3612. BL2 3664 is electrically connected to the other S/D regions of memory cells 3611 and 3612 and a S/D region of memory cell 3621 and a S/D region of memory cell 3622. BL3 3666 is electrically connected to the other S/D regions of memory cells 3621 and 3622. GL1 3642 is electrically connected to gate electrodes of memory cells 3611 and 3621. GL2 3644 is electrically connected to other gate electrodes of memory cells 3611 and 3621. GL3 3646 is electrically connected to yet another gate electrode of memory cells 3611, a gate electrode of memory cell 3612, yet another gate electrode of memory cell 3621, and a gate electrode of memory cell 3622. GL4 3648 is electrically connected to other gate electrodes of memory cell 3612 and 3622. GL5 3649 is electrically connected to yet other gate electrodes of memory cells 3612 and 3622.

Bit line control module 3692 is coupled to BL1 3662, BL2 3664, and BL3 3666, and gate line control module 3694 is coupled to GL1 3642, GL2 3644, GL3 3646, GL4 3648, and GL5 3649. Each of bit line control module 3692 and gate line control module 3694 are conventional and may include row or column decoders, voltage drivers, other suitable circuits to operate NVM array 18, or any combination thereof. Each of bit line control module 3692 and gate line control module 3694 can include more than one control module. Each of bit line control module 3692 and gate line control module 3694 can the bit lines to be biased or electrically float to achieve the proper operation of NVM array 18.

FIG. 37 illustrates a physical embodiment of a portion of NVM array 18 corresponding to the row that includes memory cells 3611 and 3612. FIG. 37 is substantially the same as an embodiment of FIG. 24, formed without doped regions 182, and with reference numbers as used in the circuit schematics are used in FIG. 37.

Charge storage regions for memory cells 3611 and 3612 are illustrated in FIGS. 36 and 37. Memory cell 3611 includes charge storage regions 36111 to 36116, and memory cell 3612 includes charge storage regions 36121 to 36126. The memory cells 3621 and 3622 include similar charge storage regions but are not illustrated in FIG. 36.

FIG. 38 includes a table that has some of the operating voltages for memory cells along the top row of memory cells, as illustrated in FIG. 36. When programming charge storage region 36111, BL1 3662 and BL2 3664 are biased to allow electrons to flow from BL2 3664 to BL1 3662. Each of GL1 3642, GL2 3644, and GL3 3646 is biased to allow carriers to flow through the channel region of memory cell 3611 regardless of the programming state at any of the charge storage regions within memory cell 3611. The electrical field generated in the channel region of memory cell 3611 near the doped region 154 (via BL1 3662) and GL1 3642 is sufficient to generate hot carriers within the channel region of memory cell 3611 near doped region 154. At least some of the hot carriers are attracted to the discontinuous storage elements at charge storage region 36111 near the junction formed near the doped region 154 within substrate 12. The programming mechanism for programming charge storage region 36111 is HCI. The other charge storage regions within memory cell 3611 are not programmed because GL1 3642, GL2 3644, and GL3 3646 are at substantially the same voltage. Memory cells 3612, 3621, and 3622 are not programmed because the voltages on GL4 3648 is zero and because BL2 3664 and BL3 3666 are at substantially the same voltage so that no current flows between those bit lines.

On a relative basis and when the substrate 12 (or associated well region therein) is biased to zero volts, when programming charge storage region 36111, the voltages on GL1 3642, GL2 3644, and GL3 3646 are in a range of approximately one to two times higher than the voltage on BL1 3662.

Charge storage region 36112 can be programmed using the voltages as listed in FIG. 38. As compared to charge storage region 36111, the voltage on BL1 3662 is reduced, and the voltage on GL1 3642 is increased. The voltages allow a higher electrical field to be formed in the channel region at a location under GL1 3642 near the intersection of the primary surface and the wall of the upper portion of the trench. The relatively higher voltage on GL1 3642 as compared to GL2 3644 allows hot carriers to be more strongly attracted to discontinuous storage elements at charge storage region 36112. The programming mechanism for programming charge storage region 36112 is SSI.

Regarding the other charge storage regions and memory cells, charge storage regions 36111, 36116, 36121, and 36126 (i.e., charge storage regions adjacent to doped regions 154 or BL2 3664) are programmed using HCI. All other charge storage regions (36112, 36113, 36114, 36115, 36122, 36123, 36124, and 36125) of memory cells 3611 and 3612 are programmed using SSI. Each memory cell in FIG. 36 can store up to six bits of data.

Similar to the embodiments described with respect to FIGS. 30 to 32, erasing of NVM array 18 can be accomplished by creating a potential difference in a range of about 12 to 16 volts between substrate 12 (or well region therein) and the gate electrodes of the memory cells. In one embodiment, erasing can be performed by biasing substrate 12 (or associated well region therein) to approximately −7 volts, setting the control gate lines to approximately +7 volts, and allowing the bit lines to electrically float. In another embodiment, erasing can be performed by placing substrate 12 (or well region therein) to approximately −7 volts, placing the gate lines to +7 volts and allowing the bit lines to electrically float. Note that the voltages used for substrate 12 and the gate line do not need to be symmetric with respect to 0 volts. For example, a combination of +5 volts and −9 volts can be used. After reading this specification, skilled artisans will be able to determine a set of voltages to be used for erasing that meets their needs or desires.

The reading of data within NVM array 18 for memory cells 3611 to 3612 is given in FIG. 38. When reading datum at charge storage region 36111 of memory cell 3611, BL1 3662 and BL2 3664 are biased so that electrons flow from BL1 3662 to BL2 3664. GL2 3644 is biased so that portions of the channel region lying adjacent to GL2 3644 and GL3 3646 allows carriers to flow regardless of the programming state at charge storage regions 36113, 36114, 36115, and 36116. GL1 3642 is biased to a voltage between the programmed and erased threshold voltages. GL2 3644 is overdriven such that fringing fields shield any charge stored in charge storage region 36112. In one particular embodiment, GL1 3642 has a voltage that is approximately 0.35 to 0.65 times the voltage difference between BL1 3662 and GL2 3644. A sense amplifier (not illustrated) coupled to the BL1 3662 or BL2 3664 will detect a higher level of current when the charge storage region 36111 is not programmed compared to when the charge storage region 36111 is programmed.

As compared to reading datum at charge storage region 36111, when reading datum at charge storage region 36112, the voltages on BL1 3662 and BL2 3664 are reversed. The voltages on GL1 3642 and GL2 3644 are between the voltages on BL1 3662 and GL3 3646. In one particular embodiment, the voltage on GL1 3642 is lower than the voltage on GL2 3644. Specifically, the read voltage on GL1 3642 is between the programmed and erased threshold voltages. The voltage on GL2 3644 is sufficient to allow carriers to flow regardless of the programming state, without being so high as to shield charge at charge storage region 36111. All other voltages can be kept substantially the same. When reading datum at charge storage region 36113, the voltages can be substantially the same as used to read charge storage region 36112 except that the voltages on BL1 3662 and BL2 3664 are reversed, and the voltages on GL1 3642 and GL2 3644 are reversed. The reading of data at other charge storage regions with memory cells 3611, 3612, 3621 to 3622 can be performed in a similar manner.

Figure 40:
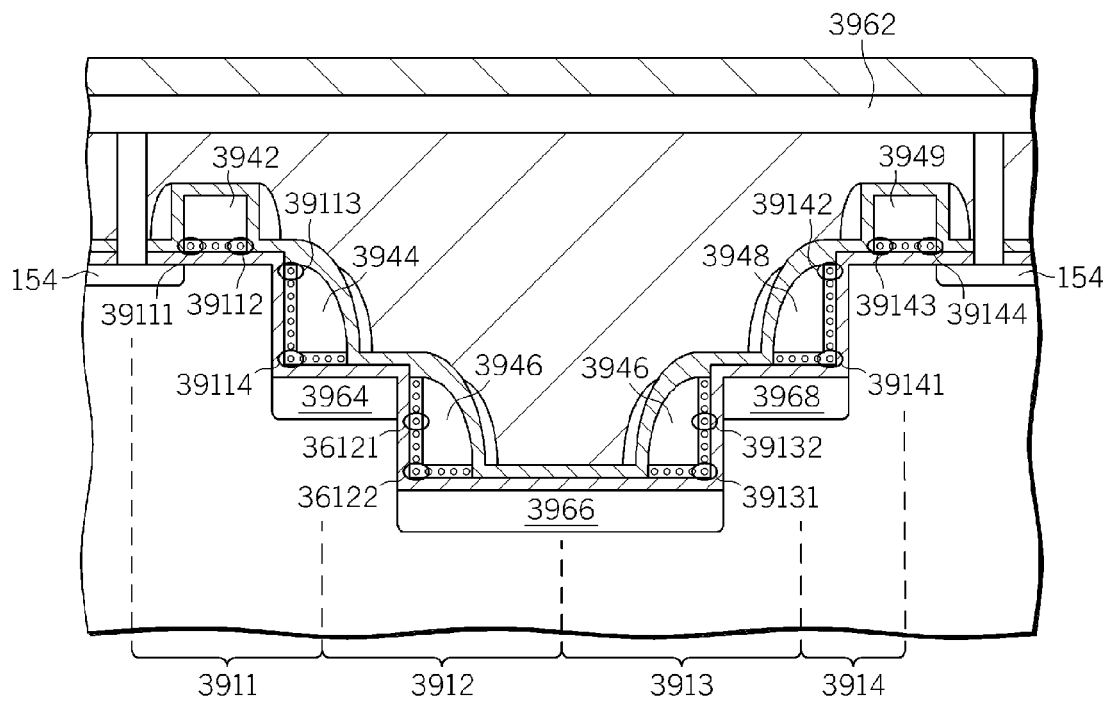
Figure 39:
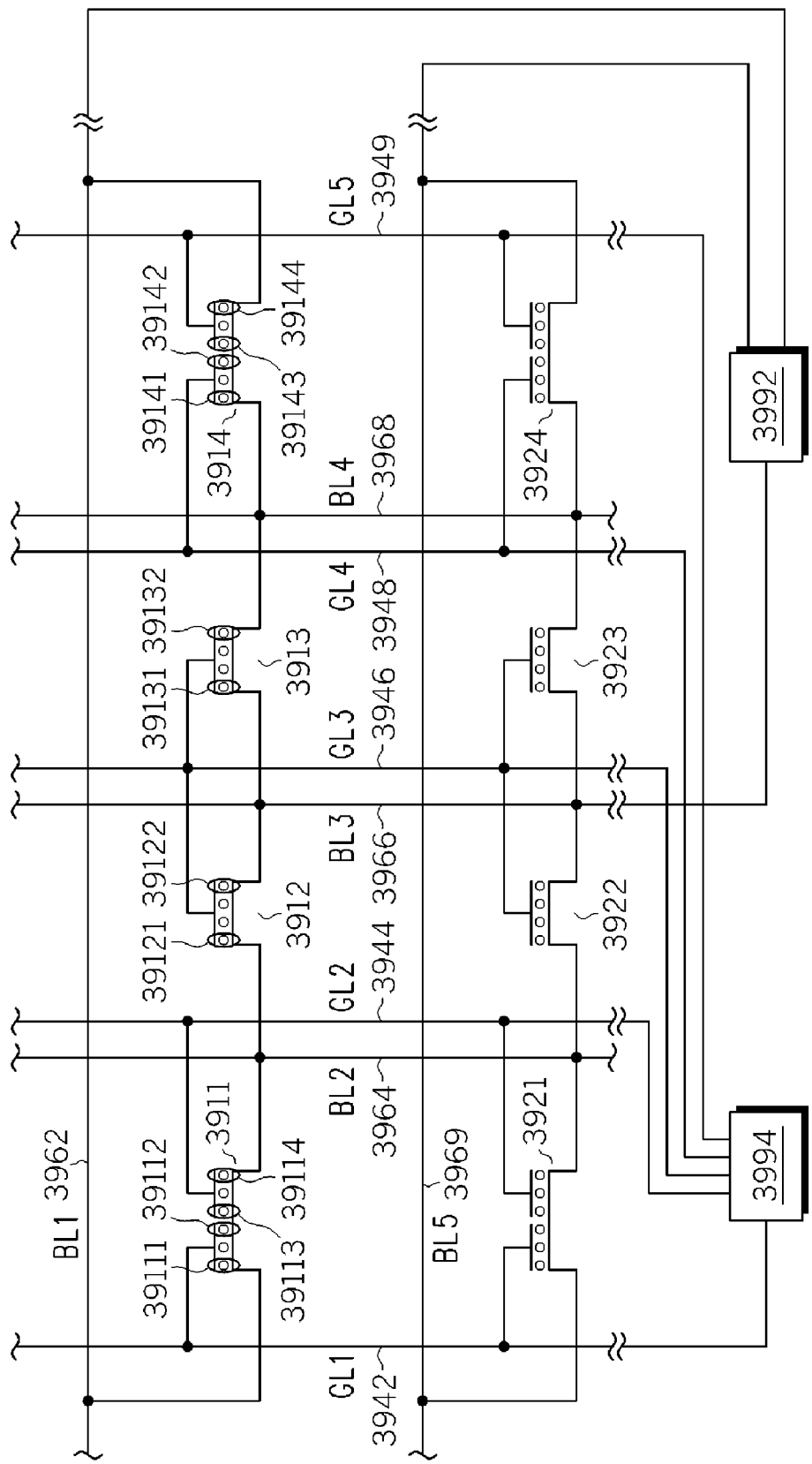

FIG. 39 includes a circuit schematic for an embodiment as described with respect to the embodiment as illustrated in FIG. 40. Memory cells 3911, 3912, 3913, 3914, 3921, 3922, 3923, and 3924 are oriented within NVM array 18, as illustrated in FIG. 39.

Referring to FIG. 39, BL1 3962 is electrically connected to a S/D region of memory cell 3911 and a S/D region of memory cell 3914. BL2 3964 is electrically connected to the other S/D region of memory cell 3911 and S/D regions of memory cells 3912, 3921, and 3922. BL3 3966 is electrically connected to the other S/D region of memory cells 3912 and 3922 and S/D regions of memory cells 3913 and 3923. BL4 3368 is electrically connected to the other S/D regions of memory cells 3913, 3923, and 3914 and S/D region of memory cell 3924. BL5 3369 is electrically connected to the other S/D regions of memory cells 3921 and 3924. In one particular embodiment, BL2 3962 and BL4 3968 can be allowed to electrically float, are electrically connected, or both.

Bit line control module 3992 is coupled to BL1 3962, BL3 3966, and BL5 3969, and gate line control module 3994 is coupled to GL1 3942, GL2 3944, GL3 3946, GL4 3948, and GL5 3949. Each of bit line control module 3992 and gate line control module 3994 are conventional and may include row or column decoders, voltage drivers, other suitable circuits to operate NVM array 18, or any combination thereof. Each of bit line control module 3992 and gate line control module 3994 can include more than one control module. Each of bit line control module 3992 and gate line control module 3994 can the bit lines to be biased or electrically float to achieve the proper operation of NVM array 18. In one embodiment, BL2 3964 and BL4 3968 are only electrically connected to source/drain regions along a column of memory cells and are not connected to any circuit outside NVM array 18, such as bit line control module 3992. In another embodiment (not illustrated), BL2 3964 and BL4 3968 are electrically connected to bit line control module 3992, and bit line control module 3992 can allow BL2 3964, BL4 3968, other bit line (not illustrated), or any combination thereof to electrically float at proper times when operating NVM array 18.

GL1 3942 is electrically connected to gate electrodes of memory cell 3911 and 3921. GL2 3944 is electrically connected to other gate electrodes of memory cells 3911 and 3921. GL3 3946 is electrically connected to gate electrodes of memory cell 3912, 3913, 3922, and 3923. In one particular embodiment, GL3 3946 is a control gate line. GL4 is electrically connected to gate electrodes of memory cells 3914 and 3924. GL5 is electrically connected to other gate electrodes of memory cells 3914 and 3924.

FIG. 40 illustrates a physical embodiment of a portion of NVM array 18 corresponding to the row that includes memory cells 3911, 3912, 3913, and 3914. FIG. 40 is substantially the same as FIG. 24 except that reference numbers as used in the circuit schematics are used in FIG. 40.

Charge storage regions for memory cells 3911 and 3912 are illustrated in FIGS. 39 and 40. Memory cell 3911 includes charge storage regions 39111, 39112, 391113, and 39114, memory cell 3912 includes charge storage regions 39121 and 39122, memory cell 3913 includes charge storage regions includes charge storage regions 39131 and 39132, and memory cell 3914 includes charge storage regions 39141, 39142, 391143, and 39144. The memory cells 3921 to 3924 include similar charge storage regions to memory cells 3911 to 3914, respectively, but are not illustrated in FIG. 39.

FIG. 41 includes a table that has some of the operating voltages for memory cells along the top row of memory cells, as illustrated in FIG. 39. When programming charge storage region 39111, BL1 3962 and BL3 3966 are biased to allow electrons to flow from BL3 3966 to BL1 3962. Each of GL1 3942, GL2 3944, and GL3 3946 is biased to allow carriers to flow through the channel regions of memory cells 3911 and 3912 regardless of the programming state at any of the charge storage regions within memory cells 3911 and 3912. For BL2 3964 floating, the bias on GL3 3964 will allow it to be pulled up to a value close to BL3 3966. Referring to FIG. 40, the channel region of memory cell 3912 adjacent to GL3 3946 along the wall of the lower portion of the trench allows electrons to flow between BL3 3966 and BL2 3964. BL2 3964 can act as an electrical short to allow electrons to continue flowing to the channel region of memory cell 3911. The channel region of memory cell 3911 is adjacent to GL1 3942 and GL2 3944 and between BL3 3966 and BL2 3964. GL1 3942 is biased to allow electrons to flow from BL2 3964 to BL1 3962 via the doped region 154. The electrical field generated in the channel region of memory cell 3911 near the doped region 154 (via BL1 3962) and GL1 3942 is sufficient to generate hot carriers within the channel region of memory cell 3911 near doped region 154. At least some of the hot carriers are attracted to the discontinuous storage elements at charge storage region 39111 near the junction formed near the doped region 154 within the substrate. The programming mechanism for programming charge storage region 39111 is HCI. Thus, carriers flow from BL3 3966 to BL1 3962 via source/drain regions of memory cells 3311 and 3312, which can be electrically connected to BL2 3964. In another embodiment (not illustrated), the source/drain regions of memory cells 3911 and 3912 can be electrically connected to each other and are not electrically connected to a bit line.

The other charge storage regions within memory cells 3911 and 3912 are not programmed because GL1 3942, GL2 3944, and GL3 3946 are at substantially the same voltage. Memory cells 3913, 3914, and 3921 to 3924 are not programmed because the voltages on GL4 3948 and GL5 3949 are zero, and because BL3 3966 and BL5 3969 are at substantially the same voltage so that no current flows between those bit lines.

On a relative basis and when the substrate 12 (or associated well region therein) is biased to zero volts, when programming charge storage region 39111, the voltages on GL1 3942, GL2 3944, and GL 3946 are in a range of approximately one to two times higher than the voltage on BL1 3962. In one particular embodiment, the voltages on GL1 3942 and BL1 3962 are approximately the same as the voltage on GL1 3942, and BL2 3964 is allowed to electrically float.

Charge storage region 39112 can be programmed using the voltages as listed in FIG. 41. As compared to charge storage region 39111, the voltage on BL1 3962 is reduced, and the voltage on GL1 3942 is increased. The voltages allow a higher electrical field to be formed in the channel region at a location under GL1 3942 near the intersection of the primary surface and the wall of the upper portion of the trench. The relatively higher voltage on GL1 3942 as compared to GL2 3944 allows hot carriers to be more strongly attracted to discontinuous storage elements at charge storage region 39112. The programming mechanism for programming charge storage region 39112 is SSI. Thus, carriers flow from BL1 3962 to BL3 3966 via source/drain regions of memory cells 3911 and 3912, which can be electrically connected to BL2 3964.

Regarding the other charge storage regions and memory cells, charge storage regions 39113, 39142, and 39143 for memory cells 3911 and 3914 are programmed using SSI. All other charge storage regions within memory cells 3911 to 3914 are programmed using HCI. All other charge storage regions for memory cells 3921 to 3924 are similar to memory cells 3911 to 3914, respectively. Each memory cell that includes two gate electrodes can store up to four bits of data, and each memory cell that includes one gate electrode can store up to two bits of data.

Similar to the embodiments described with respect to FIGS. 30 to 32, erasing of NVM array 18 can be accomplished by creating a potential difference in a range of about 12 to 16 volts between substrate 12 (or well region therein) and the gate electrodes of the memory cells. In one embodiment, erasing can be performed by biasing substrate 12 (or associated well region therein) to approximately −7 volts, setting the control gate lines to approximately +7 volts, and allowing the bit lines to electrically float. In another embodiment, erasing can be performed by placing substrate 12 (or well region therein) to approximately −7 volts, placing the gate lines to +7 volts and allowing the bit lines to electrically float. Note that the voltages used for substrate 12 and the gate line do not need to be symmetric with respect to 0 volts. For example, a combination of +5 volts and −9 volts can be used. After reading this specification, skilled artisans will be able to determine a set of voltages to be used for erasing that meets their needs or desires.

The reading of data within NVM array 18 for memory cells 3911 to 3914 is given in FIG. 41. When reading datum at charge storage region 39111 of memory cell 3911, BL1 3962 and BL3 3966 are biased so that electrons flow from BL1 3962 to BL3 3966. GL2 3944 and GL3 3946 are biased so that portions of the channel regions lying adjacent to GL2 3944 and GL3 3946 allow carriers to flow regardless of the programming state at charge storage regions 39113 and 39114 within memory cell 3911 and charge storage regions 39121 and 39122 within memory cell 3912. GL1 3942 is biased to a potential between the programmed and erased threshold voltages. In one particular embodiment, GL1 3942 has a voltage that is approximately 0.35 to 0.65 times the voltage difference between BL1 3962 and GL2 3944. A sense amplifier (not illustrated) coupled to the BL1 3962 or BL3 3966 will detect a higher level of current when the charge storage region 39111 is not programmed compared to when the charge storage region 39111 is programmed.

As compared to reading datum at charge storage region 39111, when reading datum at charge storage region 39112, the voltages on BL1 3962 and BL2 3964 are reversed. The voltage at BL1 3962 is high enough to deplete into the channel and shield charge stored at charge storage region 39111. GL2 3944 is biased just high enough to allow carriers to flow regardless of the programmed state at charge storage regions 39113 and 39114, but not so high that fringing fields shield the charge that is to be read at 32112. The voltages on GL1 3942 and GL2 3944 are between the voltages on BL1 3962 and GL3 3946. In one particular embodiment, the voltage on GL1 3942 is lower than the voltage on GL2 3944. All other voltages can be kept substantially the same. When reading datum at charge storage region 39113, the voltages can be substantially the same as used to read charge storage region 39112 except that the voltages on BL1 3962 and BL2 3964 are reversed, and the voltages on GL1 3942 and GL2 3944 are reversed. The reading of data at other charge storage regions with memory cells 3911 to 3914, 3921 to 3924 can be performed in a similar manner.

The NVM array 18 allows memory cells or portions thereof to be formed with channel regions or space-apart portions of the channel regions to be formed along different walls of different portions of a trench. The different portions of the trench allow memory cells to be potentially spaced closer to each other than if conventional planar structures were formed. In one embodiment, the formation of gate electrodes can be formed using a conventional sidewall spacer formation technique. A portion of the substrate under a ledge within the trench may or may not be doped. If a doped region is formed at the ledge, more memory cells may be formed within trench. If a doped region at the ledge is not formed, the number of bits associated with the trench may be substantially the same as compared to if the doped region at the ledge would be formed. HCI or a combination of HCI and SSI can be used to program charge storage regions within the memory cells. A designer can choose a design that uses relatively more SSI programming or less SSI program as he or she desires.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device can include a substrate that includes a trench. The trench extends into a semiconductor material and includes a ledge and a bottom, wherein the bottom lies at a depth deeper than the ledge. The electronic device can also include discontinuous storage elements, wherein a trench portion of the discontinuous storage elements lies within the trench.

In one embodiment of the first aspect, the trench further includes a first wall and a second wall, wherein the first wall lies above the ledge, and the second wall lies below the ledge.

In another embodiment, the trench further includes a first portion and a second portion, wherein the first portion lies adjacent to the first wall, the second portion lies adjacent to the second wall, and the first portion is wider than the second portion. In a particular embodiment, the electronic device includes, a first gate electrode overlying the ledge, and a second gate electrode overlying the bottom. In a more particular embodiment, the trench portion of the discontinuous storage elements includes a first portion that lies adjacent to the first wall, and a second portion that lies adjacent to the second wall. In another more particular embodiment, the electronic device further includes a third gate electrode that lies outside and adjacent to the trench. In an even more particular embodiment, the discontinuous storage elements further include a surface portion, wherein the surface portion lies between the third gate electrode and the substrate.

In another embodiment of the first aspect the discontinuous storage elements include silicon nanocrystals or metal nanoclusters. In still another embodiment of the first aspect, the electronic device further includes a first doped region lying below the bottom of the trench, and a second doped region lying along a primary surface of the substrate outside of the trench. In another particular embodiment, the electronic device further includes a third doped region lying below the ledge and at an elevation higher than the bottom of the trench, wherein each of the first, second, and third doped regions are spaced-apart from one another.

In a second aspect, an electronic device can include a substrate including a primary surface and a trench. The trench can extend into a semiconductor material and include a ledge, a bottom that lies at a depth deeper than the ledge, a first wall that lies between the primary surface and the ledge, a second wall that lies between the ledge and the bottom, a first portion of the trench that lies adjacent to the first wall, a second portion of the trench that lies adjacent to the second wall, and the first portion is wider than the second portion. The electronic device can also include discontinuous storage elements, wherein a first portion lies adjacent to the first wall, and a second portion lies adjacent to the second wall. The electronic device can additionally include a first gate electrode overlying the ledge, a second gate electrode overlying the bottom, a first doped region lying below the bottom of the trench, and a second doped region lying along the primary surface of the substrate outside of the trench.

In one embodiment of the second aspect, the electronic device further includes a third doped region lying below the ledge and at an elevation higher than the bottom of the trench, wherein each of the first, second, and third doped regions are spaced-apart from one another. In another embodiment, the electronic device further includes a third gate electrode, wherein the third gate electrode lies outside and adjacent to the trench, the substrate includes a spaced-apart region lying between the second doped region and the trench, and the third gate electrode overlies the spaced-apart region of the substrate. In still another embodiment, the discontinuous storage elements comprise silicon nanocrystals or metal nanoclusters.

In a third aspect, a process for forming an electronic device can include forming a trench within a substrate. The trench extends into a semiconductor material and includes a ledge and a bottom, wherein the bottom lies at a depth deeper than the ledge. The process can also include forming discontinuous storage elements, wherein a trench portion of the discontinuous storage elements lies within the trench.

In another embodiment of the third aspect, the process can include etching the substrate to form a first portion of the trench, wherein the first portion includes a first wall and a first bottom. The process also includes forming a sidewall spacer, and etching the substrate to form a second portion of the trench after forming the sidewall spacer. The second portion can include a second wall and a second bottom, and the ledge can include a remaining portion of the first bottom of the first portion of the trench after etching the substrate to form the second portion of the trench. In a particular embodiment, the process further includes forming a first gate electrode overlying the ledge, that has a sidewall spacer shape, and forming a second gate electrode overlying the bottom, wherein the second gate electrode has a sidewall spacer shape. In a more particular embodiment, forming the discontinuous storage elements includes forming a first portion of the discontinuous storage elements before forming the first gate electrode, wherein the first portion of the discontinuous storage elements lies adjacent to the first wall. The process also includes forming a second portion of the discontinuous storage elements before forming the second gate electrode, wherein the second portion of the discontinuous storage elements lies adjacent to the second wall. In another more particular embodiment, the process further includes forming a third gate electrode outside and adjacent to the trench. In an even more particular embodiment, forming the discontinuous storage elements further includes forming a third portion of the discontinuous storage elements before forming the third gate electrode.

In another embodiment of the third aspect, the process further includes forming a first doped region lying below the bottom of the trench, and forming a second doped region lying along a primary surface of the substrate outside of the trench. In a more particular embodiment of the third aspect, the process further includes forming a third doped region lying below the ledge and at an elevation higher than the bottom of the trench, wherein each of the first, second, and third doped regions are spaced-apart from one another.

In a fourth aspect, an electronic device can include a first bit line, a second bit line, a first memory cell, and a second memory cell. Each of the first and second memory cells can have a first source/drain region and a second source/drain region. The first source/drain region of the first memory cell can be electrically connected to the first bit line, and the first source/drain region of the second memory cell can be electrically connected to the second bit line. The second source/drain region of the second memory cell can be electrically connected to the second source/drain region of the first memory cell. The electronic device can further include a control module coupled to the first and second bit lines. The electronic device can be configured such that carriers can flow (1) from the first bit line to the second bit line via the second source/drain regions of the first and second memory cells or (2) from the second bit line to the first bit line via the second source/drain regions of the first and second memory cells.

In one embodiment of the fourth aspect, each of the first and second memory cells includes a nonvolatile memory cell. In a particular embodiment, each of the first and second memory cells includes discontinuous storage elements. In another embodiment, the electronic device further includes a third bit line and a first set of other memory cells. Each memory cell within the first set of memory cells has a first source/drain region and a second source/drain region, the first source/drain region of the each memory cell within the first set of memory cells is electrically connected to the first bit line, the second source/drain region of the each memory cell within the first set of memory cells is electrically connected to the third bit line. The electronic device still further includes a second set of other memory cells. Each memory cell within the second set of memory cells has a first source/drain region and a second source/drain region, the first source/drain region of the each memory cell within the second set of memory cells is electrically connected to the second bit line, and the second source/drain region of the each memory cell within the first and second set of memory cells is electrically connected to the third bit line. In a particular embodiment, the third bit line is only electrically connected to the first memory cell, the second memory cell, the first set of memory cells, and the second set of memory cells. In still another embodiment of the fourth aspect, the first memory cell is configured to store up to a first number of bits, and the second memory cell is configured to store up to a second number of bits that is different from the first number of bits.

In a fifth aspect, an electronic device can include a plurality of gate lines including a first gate line, a first memory cell electrically connected to the first gate line, and a second memory cell electrically connected to a greater number of gate lines within the plurality of gate lines, as compared to the first memory cell.

In one embodiment of the fifth aspect, the first and second memory cells are electrically connected to each other. In another embodiment, the first memory cell is not electrically connected to any gate line other than the first gate line, and the second memory cell is electrically connected to a second gate line and a third gate line, wherein the plurality of gate lines includes the second and third gate lines. In a particular embodiment, the electronic device further includes a first bit line electrically connected to the first memory cell, a second bit line electrically connected to the second memory cell, and a third bit line electrically connected to the first and second memory cells. In a more particular embodiment, the first gate line and the first and second bit lines are oriented in a first orientation, wherein the first orientation is a row or a column. In another more particular embodiment, all bit lines and all gate lines electrically connected to the first memory cell or the second memory cell, except for one bit line or one gate line, are oriented in a first orientation, wherein the first orientation is a row or a column. In still another embodiment, each of the first and second memory cells includes discontinuous storage elements.

In a sixth aspect, a process for operating a memory array can include performing a first operation. The first operation can include (1) programming the first memory cell using hot carrier injection, wherein a bit line is electrically connected to the first memory cell and electrically floats during programming the first memory cell, (2) programming the second memory cell using hot carrier injection, wherein a bit line is electrically connected to the second memory cell and electrically floats during programming the second memory cell, (3) reading the first memory cell, wherein a bit line is electrically connected to the first memory cell and electrically floats during reading the first memory cell, or (4) reading the second memory cell, wherein a bit line is electrically connected to the second memory cell and electrically floats during reading the first memory cell.

In one embodiment of the sixth aspect, the process further includes performing a second operation. Performing the first operation includes programming the first memory cell using hot carrier injection, wherein the bit line is electrically connected to the first memory cell and electrically floats during programming the first memory cell. Performing the second operation includes programming the second memory cell using hot carrier injection, wherein the bit line electrically floats during programming the second memory cell. In another embodiment, performing the second operation includes reading the first memory cell, wherein the bit line electrically floats during reading the first memory cell.

In still another embodiment of the sixth aspect, the process further includes performing a second operation, a third operation, and a fourth operation. Performing the first operation includes programming the first memory cell using hot carrier injection, wherein the bit line is electrically connected to the first memory cell and electrically floats during programming the first memory cell. Performing the second operation includes programming the second memory cell using hot carrier injection, wherein the bit line is electrically connected to the second memory cell and electrically floats during programming the second memory cell. Performing the third operation includes reading the first memory cell, wherein the bit line electrically floats during reading the first memory cell. Performing the fourth operation includes reading the second memory cell, wherein the bit line electrically floats during reading the second memory cell.

In a further embodiment of the sixth aspect, the hot carrier injection includes a conventional hot carrier injection or a source-side injection. In still a further embodiment, each of the first and second memory cells includes discontinuous storage elements.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An electronic device comprising:
   a first bit line;
   a second bit line;
   a third bit line;
   a first set of memory cells including a first memory cell, wherein;
   each memory cell within the first set of memory cells has a first source/drain region and a second source/drain region;
   the first source/drain region of each memory cell within the first set of memory cells is electrically connected to the first bit line; and
   the second source/drain region of each memory cell within the first set of memory cells is electrically connected to the third bit line;
   a second set of memory cells including a second memory cell, wherein:
   each memory cell within the second set of memory cells has a first source/drain region and a second source/drain region;
   the first source/drain region of each memory cell within the second set of memory cells is electrically connected to the second bit line; and
   the second source/drain region of each memory cell within the first and second sets of memory cells is electrically connected to one another and to the third bit line;
   a control module coupled to the first and second bit lines, wherein the electronic device is configured such that carriers can flow (1) from the first bit line to the second bit line via the second source/drain regions of the first and second memory cells or (2) from the second bit line to the first bit line via the second source/drain regions of the first and second memory cells.

2. The electronic device of claim 1, wherein each of the first and second memory cells comprises a nonvolatile memory cell.

3. The electronic device of claim 2, wherein each of the first and second memory cells comprises discontinuous storage elements.

4. The electronic device of claim 1, wherein the third bit line is only electrically connected to the first memory cell, the second memory cell, the first set of memory cells, and the second set of memory cells.

5. The electronic device of claim 1, wherein:
   the first memory cell is configured to store up to a first number of bits; and
   the second memory cell is configured to store up to a second number of bits that is different from the first number of bits.

6. The electronic device of claim 1, further comprising a third bit line that is electrically connected to the first and second memory cells and electrically floats.

7. The electronic device of claim 6, wherein the third bit line is configured to electrically float when programming, erasing, and reading the first memory cell.

8. The electronic device of claim 7, wherein the third bit line is configured to electrically float when programming, erasing, and reading the second memory cell.

9. The electronic device of claim 1, wherein the third bit line electrically floats.

10. The electronic device of claim 1, wherein the third bit line is configured to electrically float when programming, erasing, and reading the first memory cell.

11. The electronic device of claim 10, wherein the third bit line is configured to electrically float when programming, erasing, and reading the second memory cell.

12. The electronic device of claim 5, wherein the first memory cell is configured to store twice as many bits as compared to the second memory cell.

13. The electronic device of claim 12, further comprising:
   a first gate line electrically connected to a first gate electrode of the first memory cell;
   a second gate line electrically connected to a second gate electrode of the first memory cell; and
   a third gate line electrically connected to a gate electrode of the second memory cell, wherein the first, second, and third gate lines are different gate lines, and the third gate line is an only gate line electrically connected to the second memory cell.

14. The electronic device of claim 13, wherein:
   a first set of discontinuous storage elements lies between the first gate electrode and a substrate, wherein the first set of discontinuous storage elements is configured to store a first set of bits within the first memory cell; and
   a second set of discontinuous storage elements lies between the second gate electrode and the substrate, wherein the second set of discontinuous storage elements is configured to store a second set of bits within the first memory cell.

15. The electronic device of claim 14, wherein:
   the first set of discontinuous storage elements overlies a primary surface of the substrate;
   the second set of discontinuous storage elements lies at elevations between the primary surface of the substrate and a ledge within a trench within the substrate; and
   a third set of discontinuous storage elements lies between the gate electrode of the second memory cell and the substrate, and at elevations between the ledge and a bottom of the trench.

16. The electronic device of claim 1, further comprising:
   a first gate line electrically connected to a first gate electrode of the first memory cell; and
   a second gate line electrically connected to a second gate electrode of the second memory cell, wherein the first and second gate lines are different gate lines.

17. The electronic device of claim 16, wherein:
   a first set of discontinuous storage elements lies between the first gate electrode and a substrate, wherein the first set of discontinuous storage elements is configured to store a first set of bits within the first memory cell; and
   a second set of discontinuous storage elements lies between the second gate electrode and the substrate, wherein the second set of discontinuous storage elements is configured to store a second set of bits within the second memory cell.

18. The electronic device of claim 17, wherein the first memory cell and the second memory cell are configured to store a same number of bits.

19. The electronic device of claim 17, wherein:
   the first set of discontinuous storage elements lies at elevations between the primary surface of the substrate and a ledge within a trench within the substrate; and
   the second set of discontinuous storage elements lies at elevations between the ledge and a bottom of the trench.

* * * * *